(12) United States Patent
Takaoka

(10) Patent No.: US 12,062,655 B2
(45) Date of Patent: Aug. 13, 2024

(54) SEMICONDUCTOR DEVICE AND METHOD FOR MANUFACTURING SAME

(71) Applicant: ROHM CO., LTD., Kyoto (JP)

(72) Inventor: Jun Takaoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 386 days.

(21) Appl. No.: 17/615,390

(22) PCT Filed: May 21, 2020

(86) PCT No.: PCT/JP2020/020131
§ 371 (c)(1),
(2) Date: Nov. 30, 2021

(87) PCT Pub. No.: WO2020/255617
PCT Pub. Date: Dec. 24, 2020

(65) Prior Publication Data
US 2022/0231011 A1      Jul. 21, 2022

(30) Foreign Application Priority Data
Jun. 21, 2019   (JP) .................................. 2019-115733

(51) Int. Cl.
*H01L 27/06*      (2006.01)
*H01L 21/265*     (2006.01)
(Continued)

(52) U.S. Cl.
CPC .... *H01L 27/0664* (2013.01); *H01L 21/26513* (2013.01); *H01L 21/266* (2013.01);
(Continued)

(58) Field of Classification Search
CPC .......... H01L 27/0664; H01L 21/26513; H01L 21/266; H01L 22/12; H01L 22/32;
(Continued)

(56) References Cited

U.S. PATENT DOCUMENTS 11,450,752 B2 * 9/2022 Fukuda ................. H01L 29/861
2018/0166436 A1 6/2018 Sato

FOREIGN PATENT DOCUMENTS

| JP | 2003258111 | 9/2003 |
|---|---|---|
| JP | 2007134684 | 5/2007 |

(Continued)

OTHER PUBLICATIONS

International Search Report and Written Opinion issued for International Patent Application No. PCT/JP2020/020131, Date of mailing: Jul. 28, 2020, 8 pages including English translation of Search Report.

(Continued)

*Primary Examiner* — David Vu
(74) *Attorney, Agent, or Firm* — XSENSUS LLP

(57) ABSTRACT

A method for manufacturing a semiconductor device is provided in which a semiconductor element that generates heat during operation is formed in an active region of a semiconductor substrate and a temperature sensitive diode sensor arranged to detect temperature is formed in a temperature sensitive diode region of the semiconductor substrate. The method includes: forming a polysilicon layer that composes the temperature sensitive diode sensor in the temperature sensitive diode region, forming a mask, and introducing impurities through the mask into the semiconductor substrate and the polysilicon layer. The mask has an element pattern having an element opening through which a region composing the semiconductor element is exposed in (Continued)

the active region, a diode pattern having a diode opening through which a portion of the temperature sensitive diode region is exposed, and a monitoring pattern provided within the diode pattern with a size smaller than that of the diode opening.

8 Claims, 30 Drawing Sheets

(51) Int. Cl.
    *H01L 21/266* (2006.01)
    *H01L 21/66* (2006.01)
    *H01L 23/34* (2006.01)
    *H01L 29/06* (2006.01)
    *H01L 29/66* (2006.01)
    *H01L 29/739* (2006.01)

(52) U.S. Cl.
    CPC .............. *H01L 22/12* (2013.01); *H01L 22/32* (2013.01); *H01L 23/34* (2013.01); *H01L 29/66348* (2013.01); *H01L 29/7397* (2013.01)

(58) Field of Classification Search
    CPC ............... H01L 23/34; H01L 29/66348; H01L 29/7397; H01L 22/34; H01L 27/0629; H01L 29/16; H01L 29/0692; H01L 29/4238; H01L 29/0696; H01L 29/78; H01L 29/861
    See application file for complete search history.

(56) References Cited

FOREIGN PATENT DOCUMENTS

| | | |
|---|---|---|
| JP | 2017103272 | 6/2017 |
| JP | 2019087635 | 6/2019 |
| WO | 2017141560 | 8/2017 |

OTHER PUBLICATIONS

International Preliminary Report on Patentability issued for International Patent Application No. PCT/JP2020/020131, Date of mailing: Dec. 30, 2021, 10 pages including English translation.

* cited by examiner

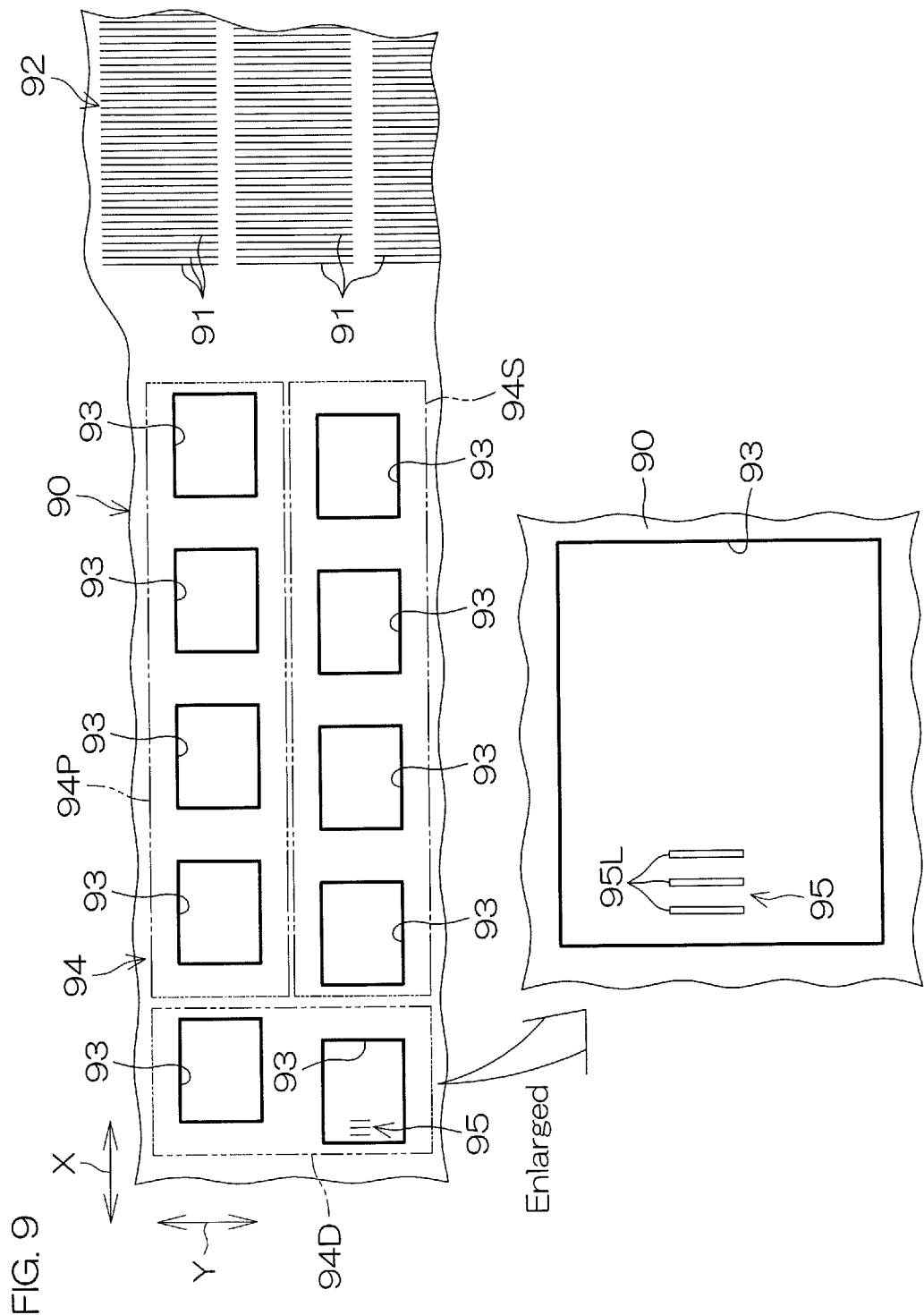

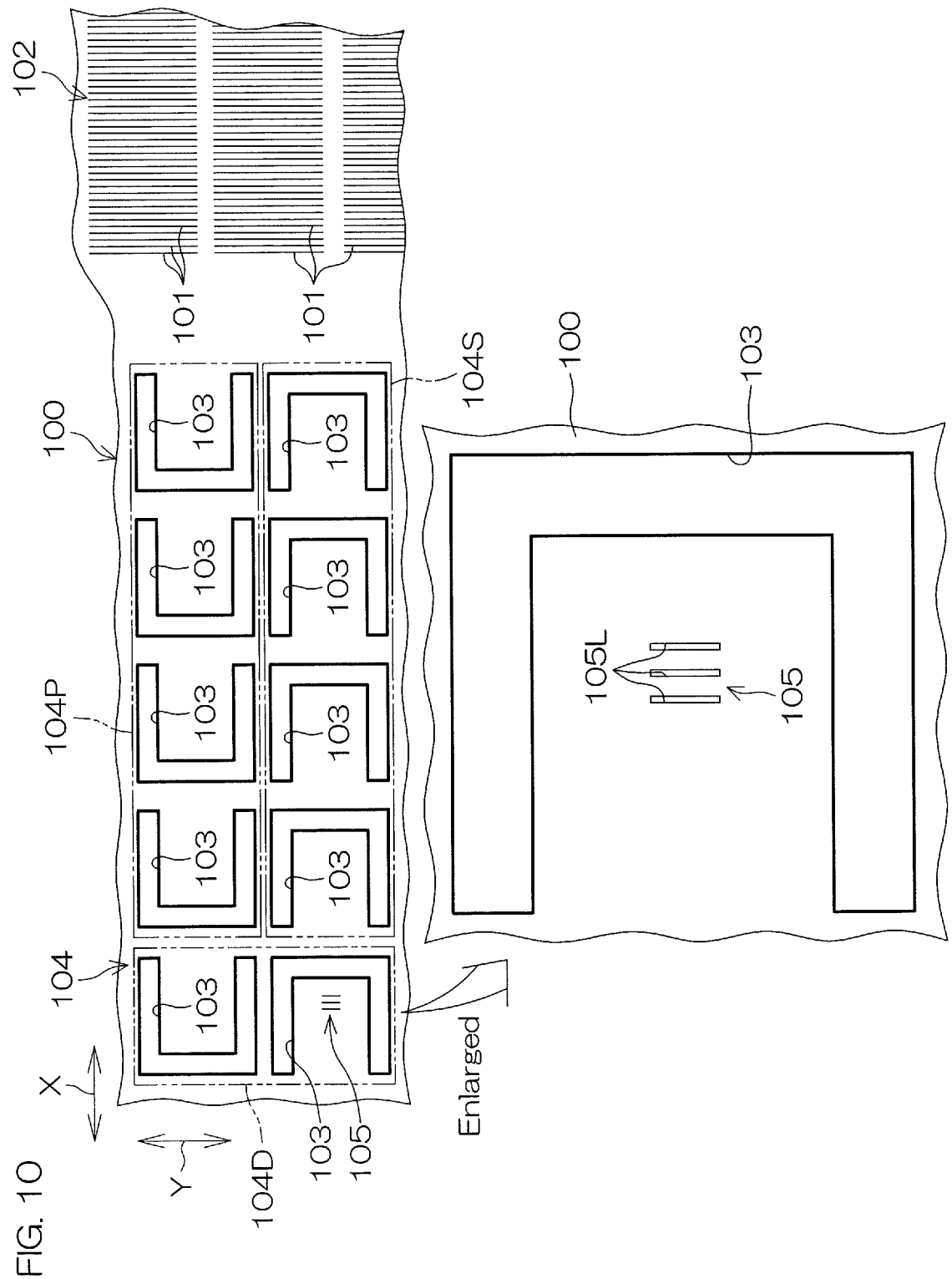

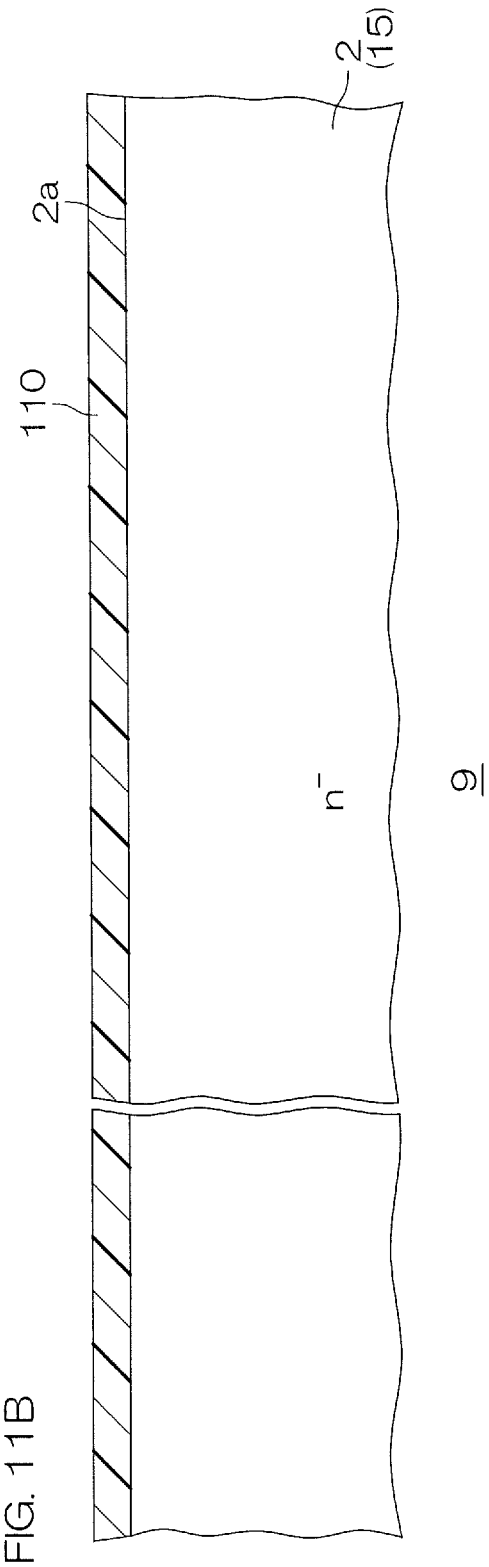

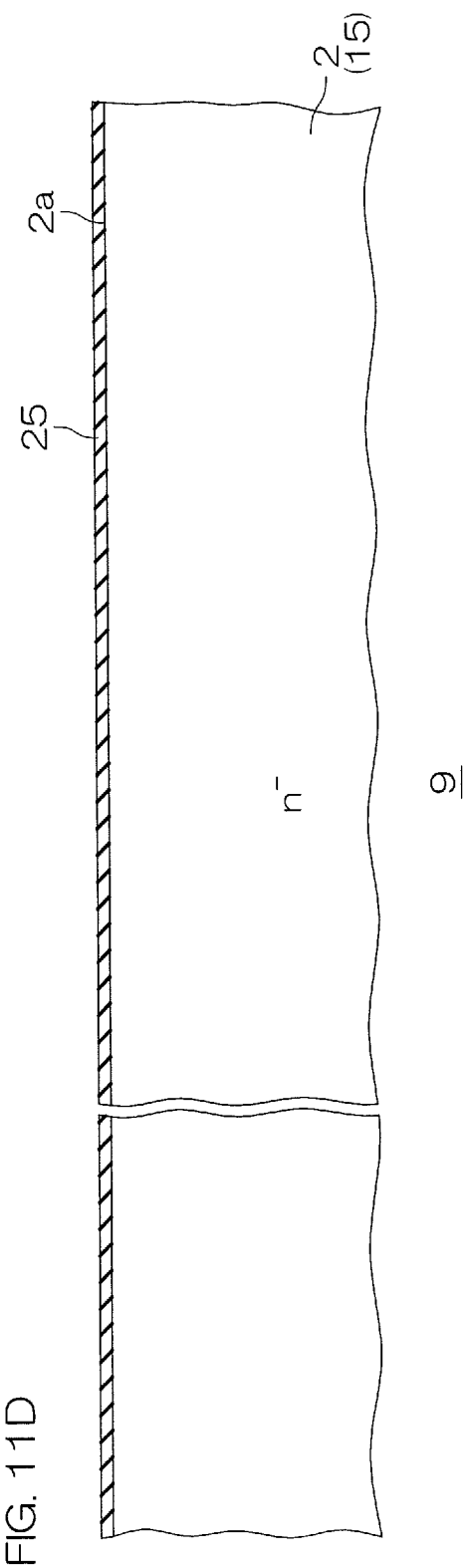

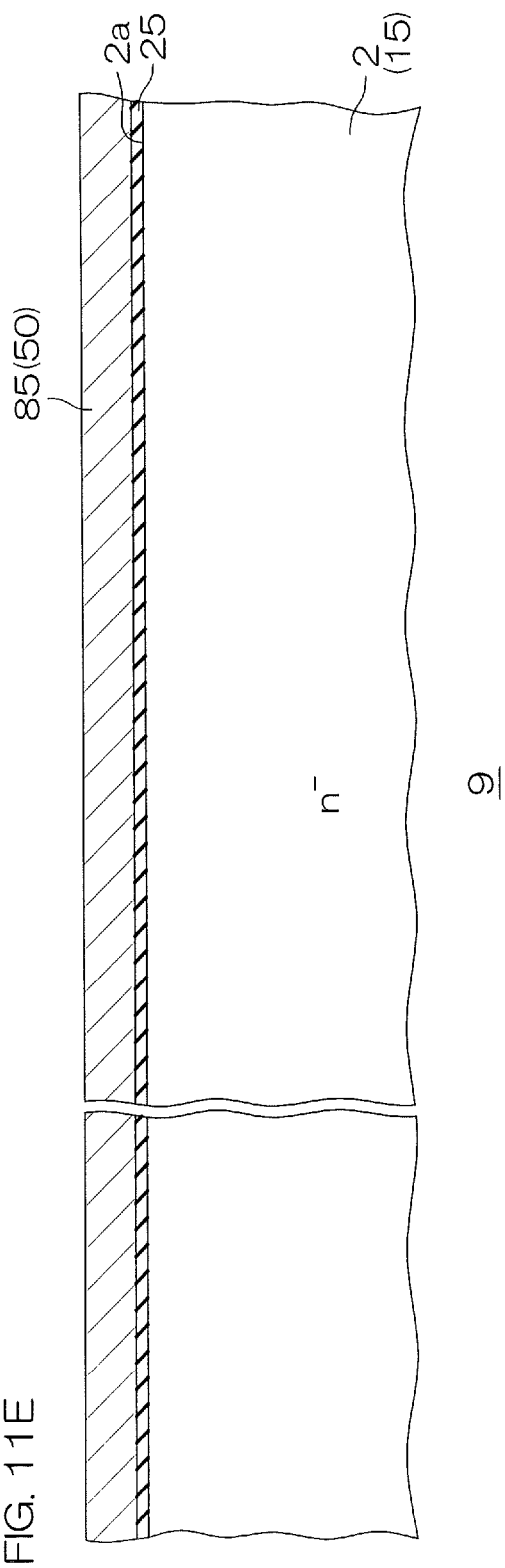

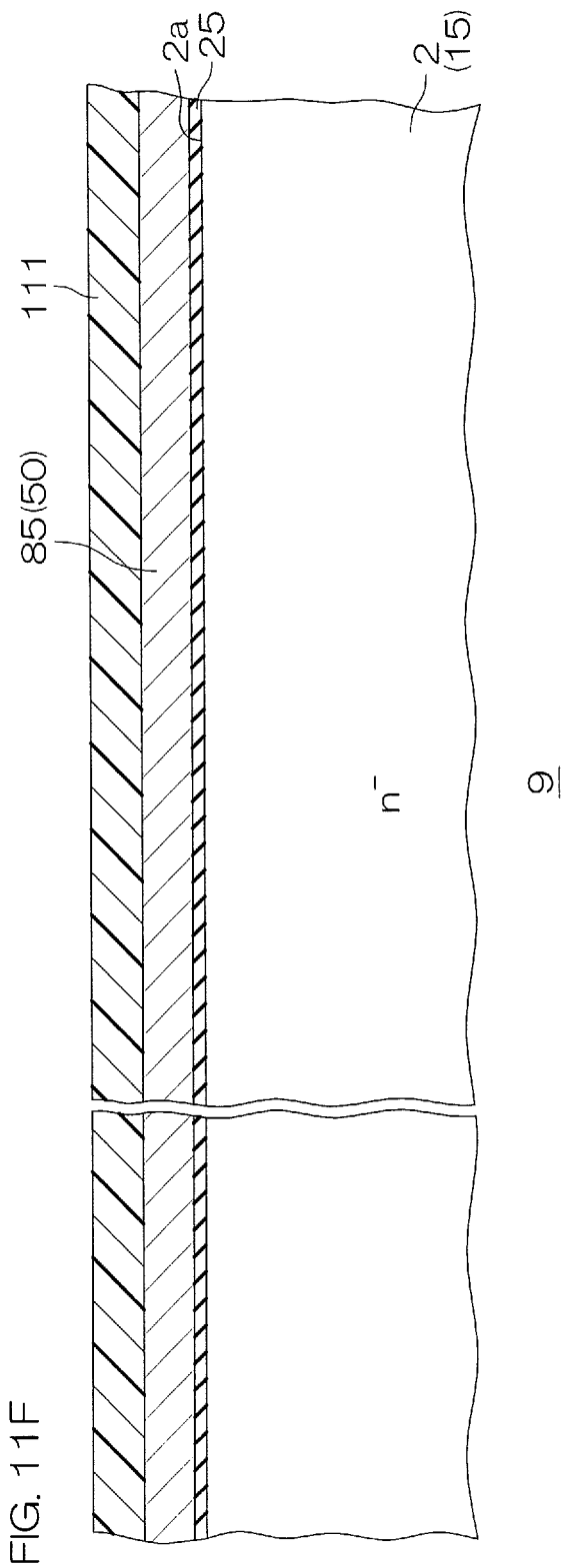

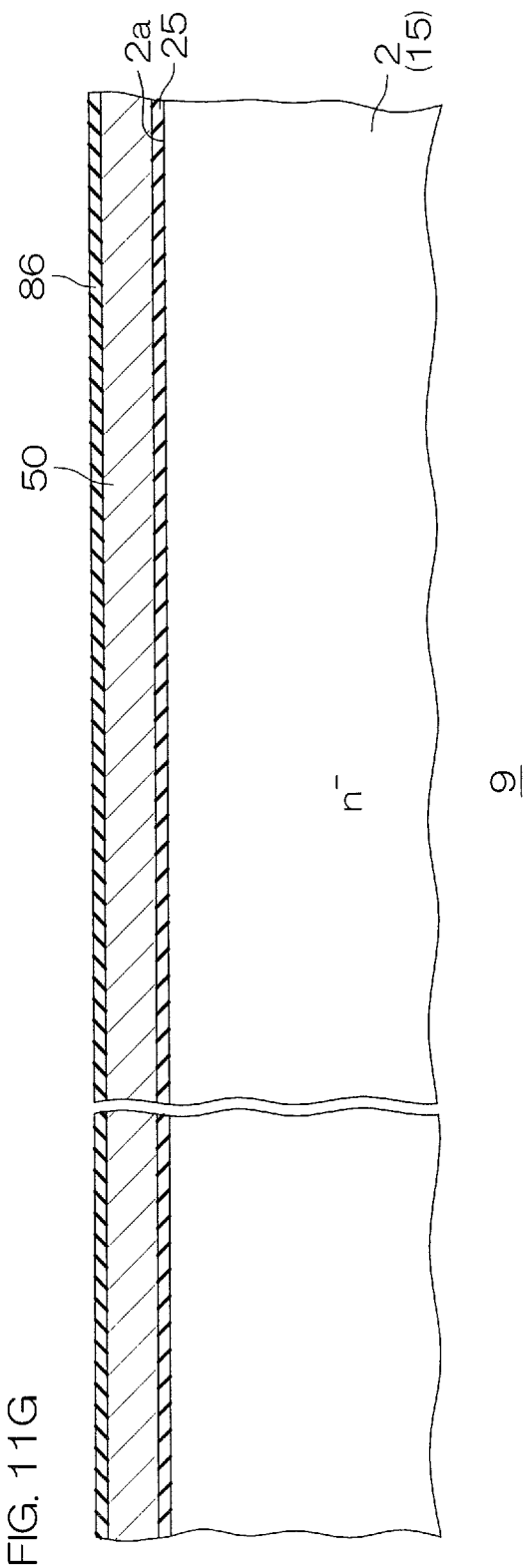

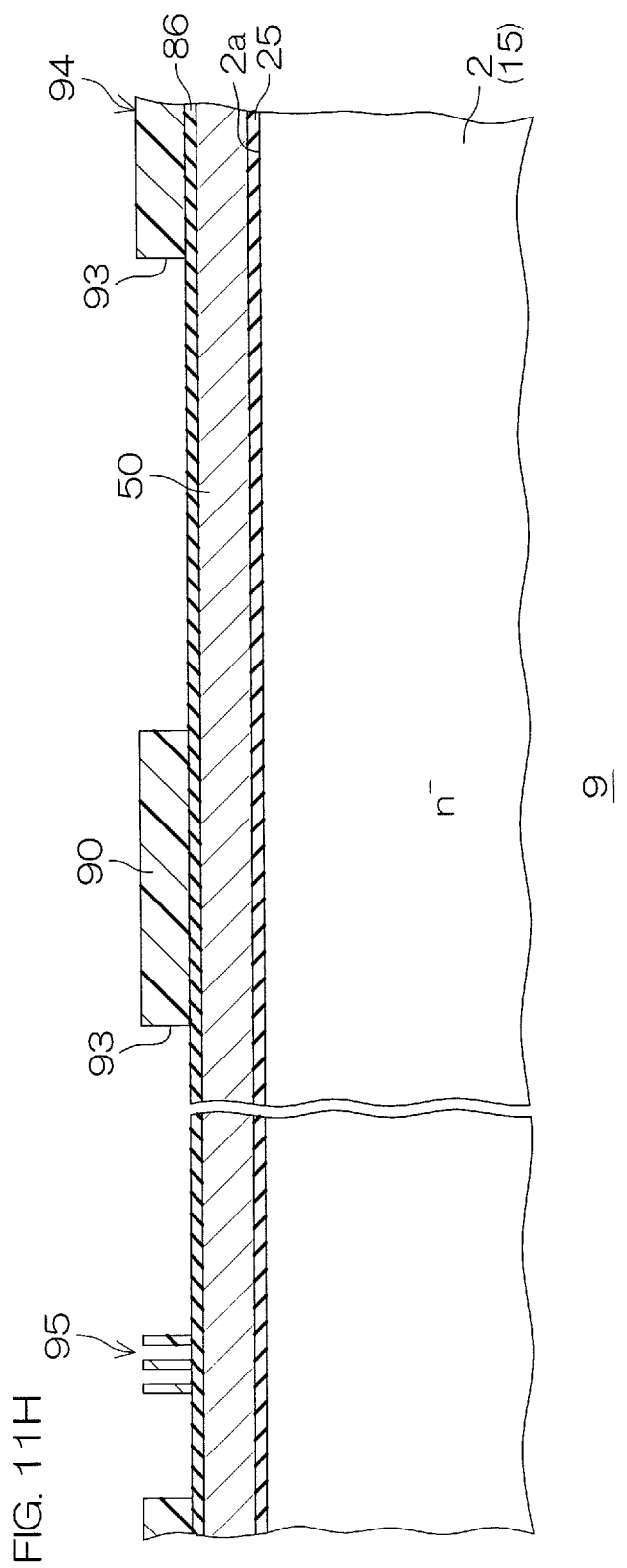

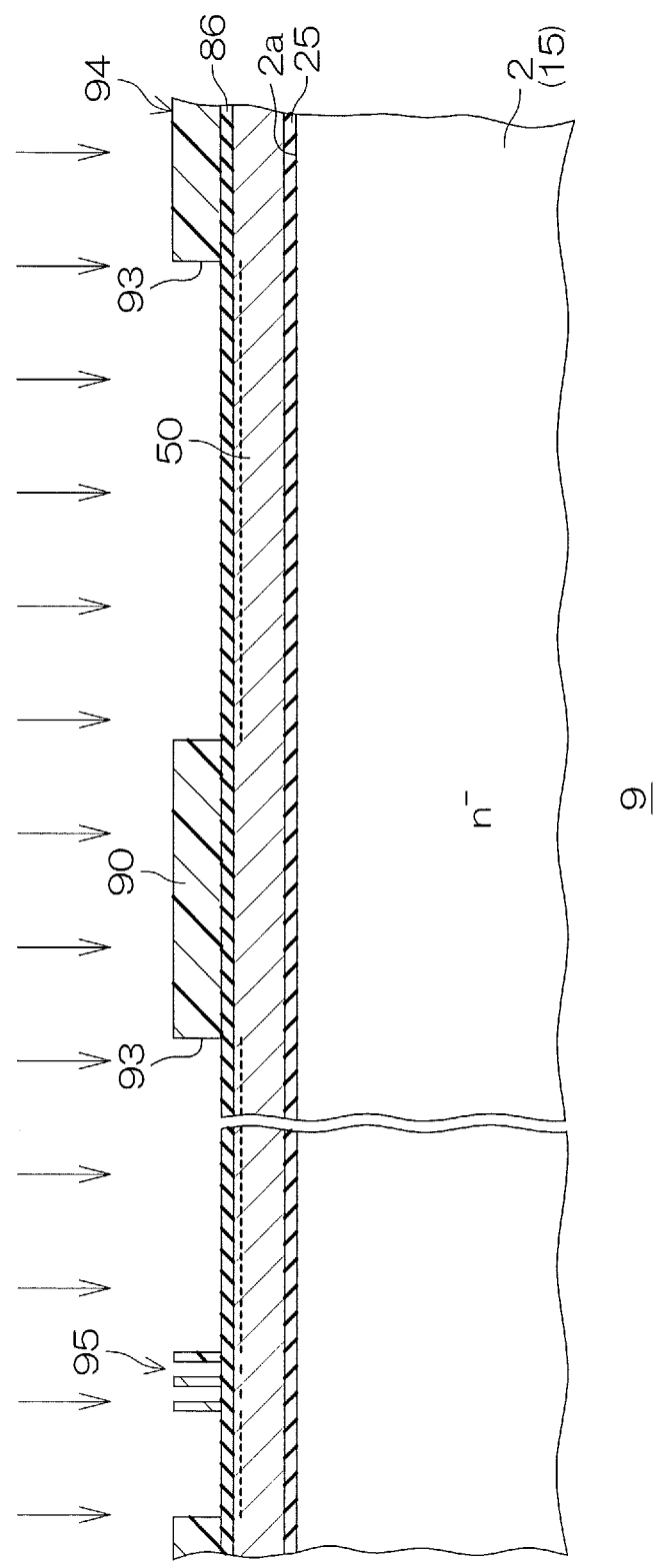

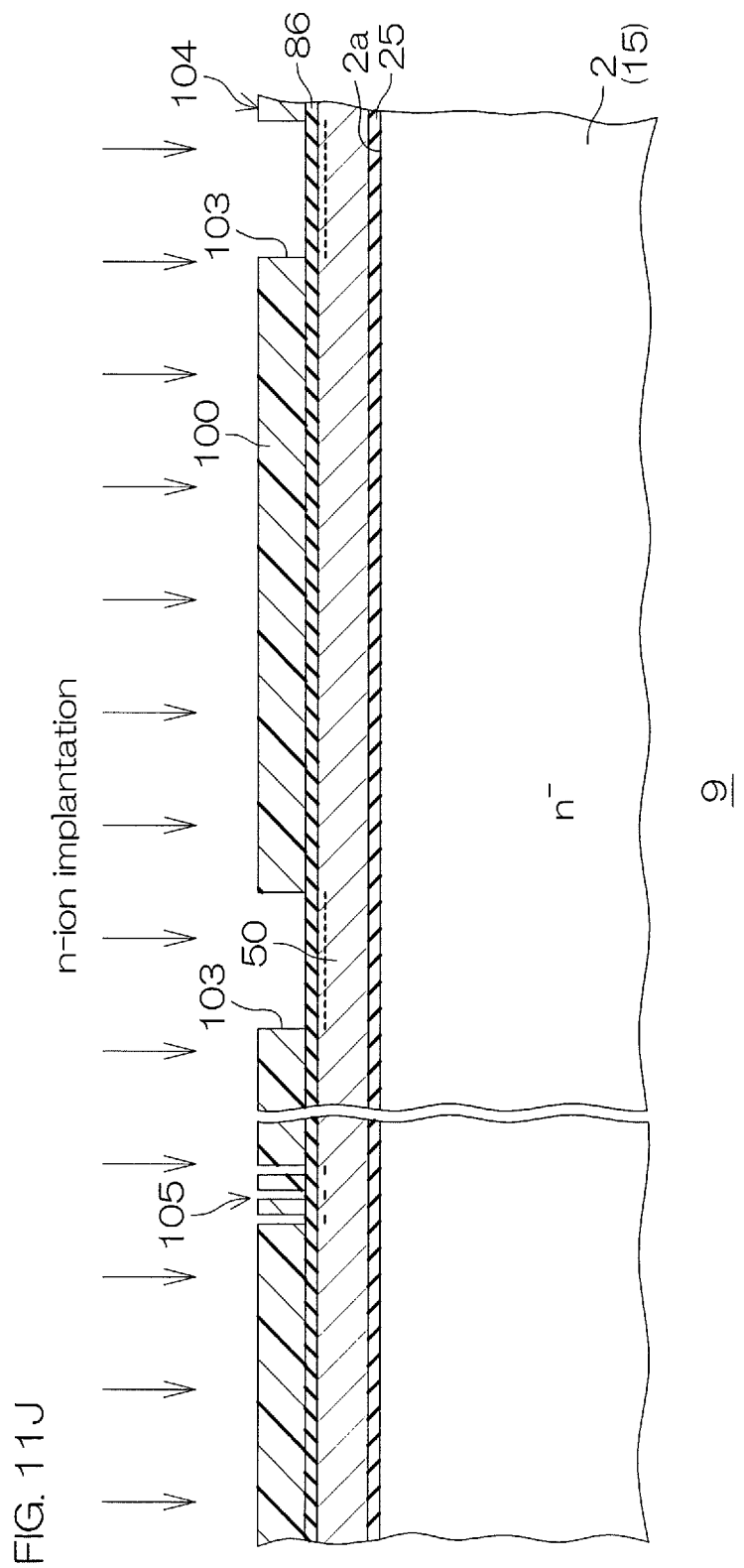

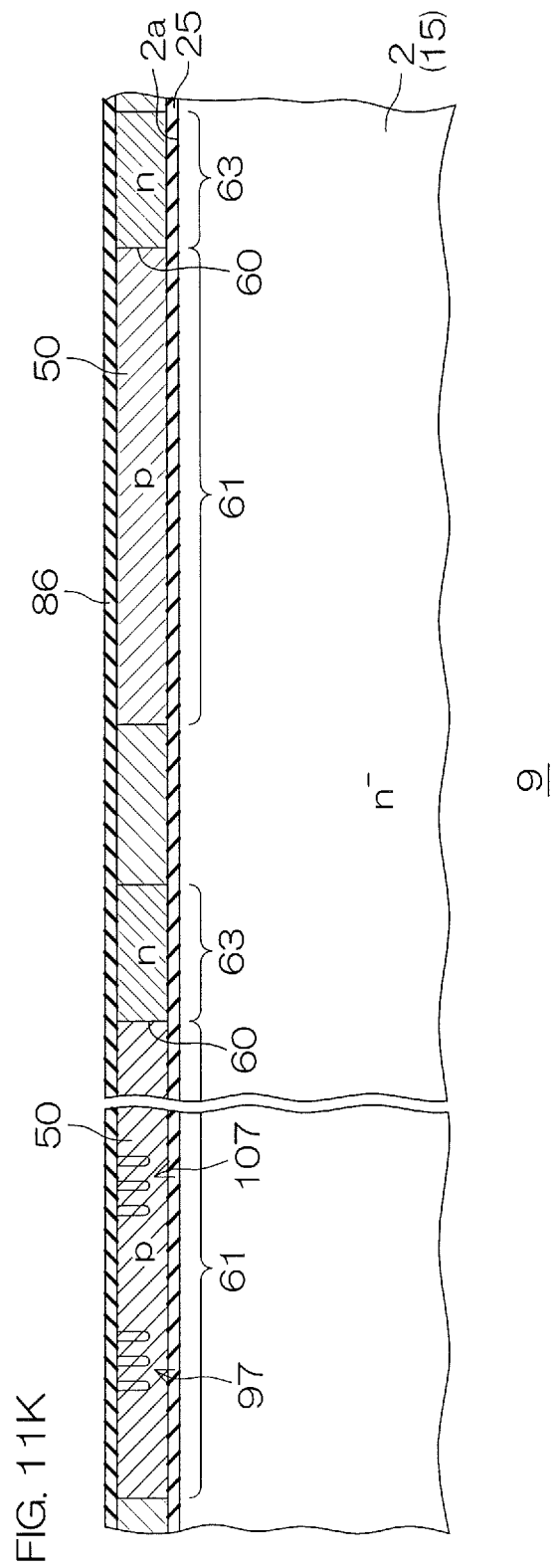

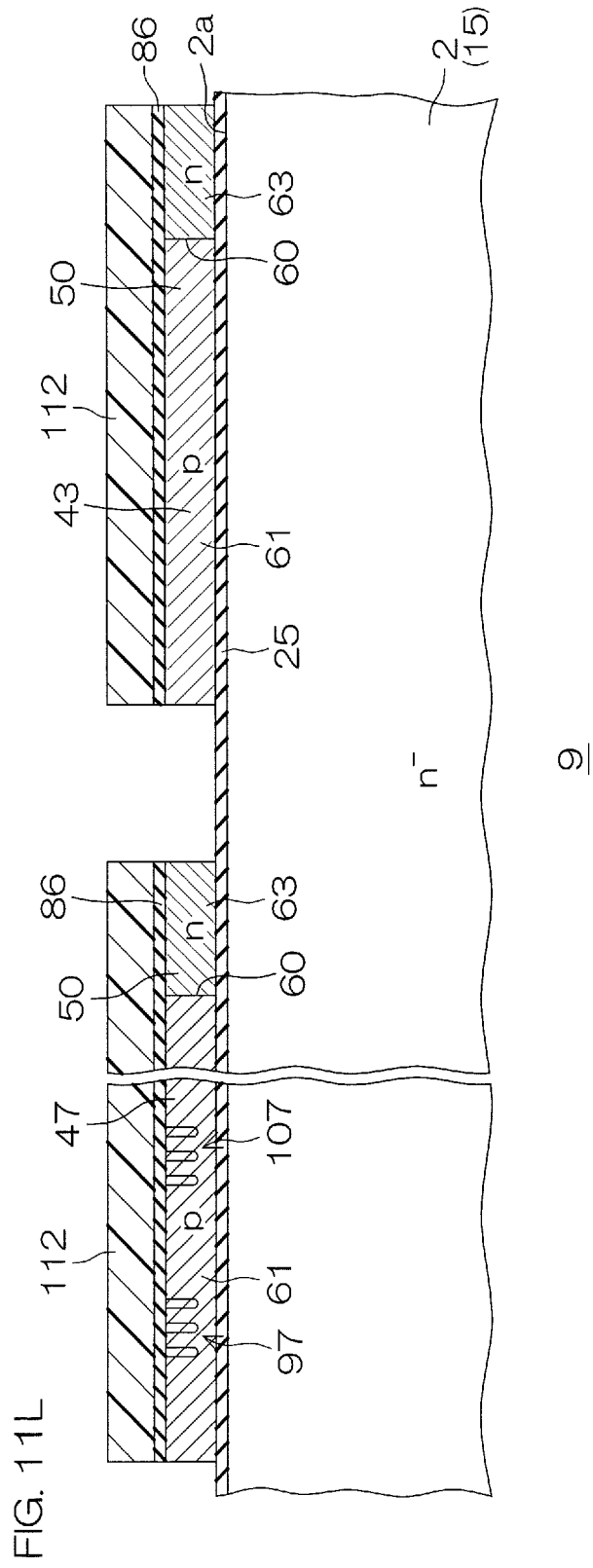

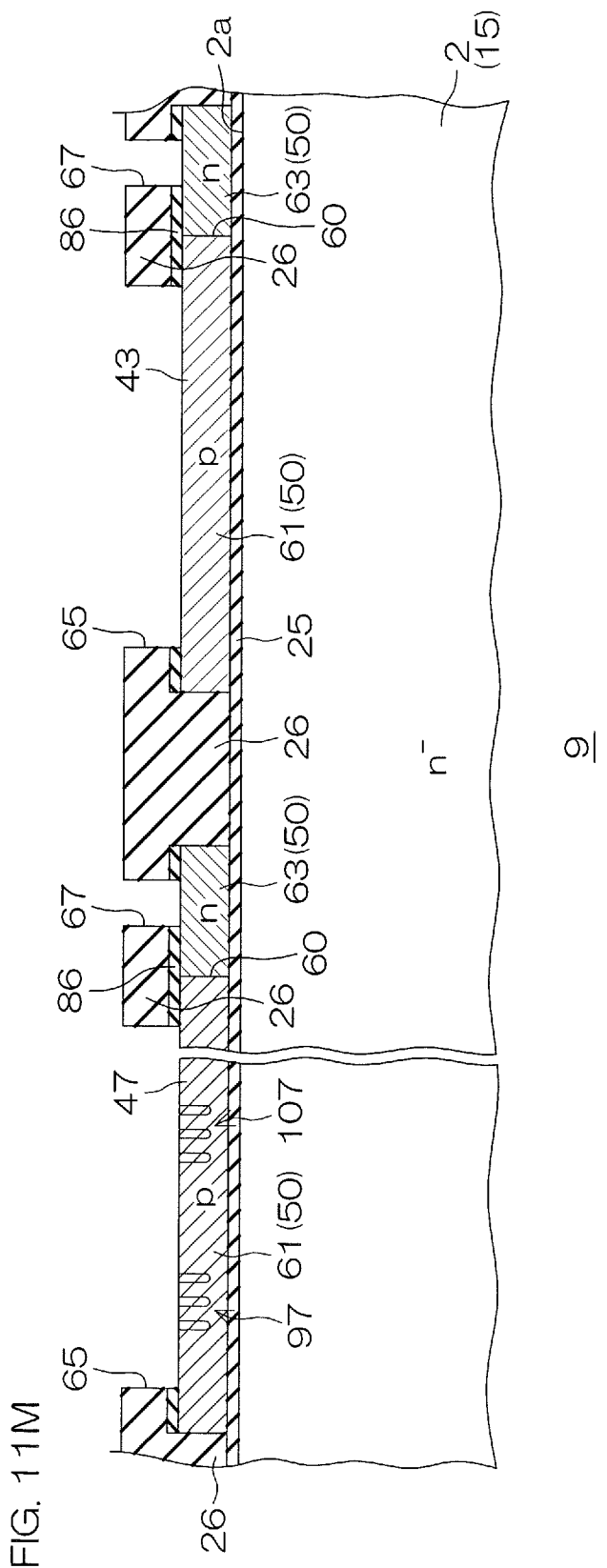

SEMICONDUCTOR DEVICE AND METHOD FOR MANUFACTURING SAME

TECHNICAL FIELD

The present invention relates to a semiconductor device including a temperature sensitive diode and a method for manufacturing the same.

BACKGROUND ART

A semiconductor device including a temperature sensitive diode is disclosed in, for example, Japanese Patent Application Publication No. 2017-103272. The semiconductor device in Japanese Patent Application Publication No. 2017-103272 includes a temperature sensitive diode composed of a polysilicon diode on a semiconductor chip with a power transistor formed therein. The forward voltage of the temperature sensitive diode varies depending on the temperature of the semiconductor chip. It is therefore possible to detect the temperature of the semiconductor chip by monitoring the forward voltage. For example, anomalous heat generation can be detected using the temperature sensitive diode. In response to detection of anomalous heat generation, the power transistor can be turned off to avoid the semiconductor device being damaged due to the anomalous heat generation.

SUMMARY OF THE INVENTION

Technical Problem

Temperature detection using a temperature sensitive diode depends on the forward characteristics of the temperature sensitive diode. It is therefore necessary to integrate the temperature sensitive diode so as to have intended forward characteristics. If the temperature sensitive diode does not have the intended forward characteristics, the semiconductor device is a defective product that cannot be launched onto the market. The integration accuracy of the temperature sensitive diode thus affects production yield.

A preferred embodiment of the present invention provides a method for manufacturing a semiconductor device with an improved yield.

A preferred embodiment of the present invention provides a semiconductor device that can be confirmed to have been manufactured using a highly accurate method.

Solution to Problem

A preferred embodiment of the present invention provides a method for manufacturing a semiconductor device in which a semiconductor element that generates heat during operation is formed in an active region of a semiconductor substrate and a temperature sensitive diode sensor arranged to detect temperature is formed in a temperature sensitive diode region of the semiconductor substrate. The method includes the step of forming a polysilicon layer that composes the temperature sensitive diode sensor in the temperature sensitive diode region. The method includes the step of forming a mask. The mask has an element pattern having an element opening through which a region composing the semiconductor element is exposed in the active region. The mask has a diode pattern having a diode opening through which a portion of the temperature sensitive diode region is exposed. The mask has a monitoring pattern provided within the diode pattern with a size smaller than that of the diode opening. The method includes the step of introducing impurities through the mask into the semiconductor substrate and the polysilicon layer.

A preferred embodiment of the present invention also provides a semiconductor device. The semiconductor device includes a semiconductor substrate. The semiconductor device includes a semiconductor element that is included in an active region of the semiconductor substrate and generates heat during operation. The semiconductor device includes a temperature sensitive diode sensor included in a temperature sensitive diode region of the semiconductor substrate and arranged to detect temperature. The temperature sensitive diode sensor includes a polysilicon layer formed in the temperature sensitive diode region. A diode is formed in the temperature sensitive diode region. The diode includes an anode region and a cathode region. The anode region may be a region in which p-type impurities are introduced into the polysilicon layer. The cathode region may be a region in which n-type impurities are introduced into the polysilicon layer. In the temperature sensitive diode region, a monitoring impurity pattern having a line width smaller than that in the anode region or the cathode region is formed in the polysilicon layer.

The aforementioned as well as yet other objects, features, and effects of the present invention will be made clear by the following description of the preferred embodiments made with reference to the accompanying drawings.

BRIEF DESCRIPTION OF DRAWINGS

FIG. 9 shows a pattern example of a photoresist mask applied to p-type impurity ion implantation.

FIG. 10 shows a pattern example of a photoresist mask applied to n-type impurity ion implantation.

FIG. 11B is a cross-sectional view of a main portion for illustrating the method for manufacturing a semiconductor device.

FIG. 11D is a cross-sectional view of a main portion for illustrating the method for manufacturing a semiconductor device.

FIG. 11E is a cross-sectional view of a main portion for illustrating the method for manufacturing a semiconductor device.

FIG. 11F is a cross-sectional view of a main portion for illustrating the method for manufacturing a semiconductor device.

FIG. 11G is a cross-sectional view of a main portion for illustrating the method for manufacturing a semiconductor device.

FIG. 11H is a cross-sectional view of a main portion for illustrating the method for manufacturing a semiconductor device.

FIG. 11I is a cross-sectional view of a main portion for illustrating the method for manufacturing a semiconductor device.

FIG. 11J is a cross-sectional view of a main portion for illustrating the method for manufacturing a semiconductor device.

FIG. 11K is a cross-sectional view of a main portion for illustrating the method for manufacturing a semiconductor device.

FIG. 11L is a cross-sectional view of a main portion for illustrating the method for manufacturing a semiconductor device.

FIG. 11M is a cross-sectional view of a main portion for illustrating the method for manufacturing a semiconductor device.

DESCRIPTION OF EMBODIMENTS

Figure 1:
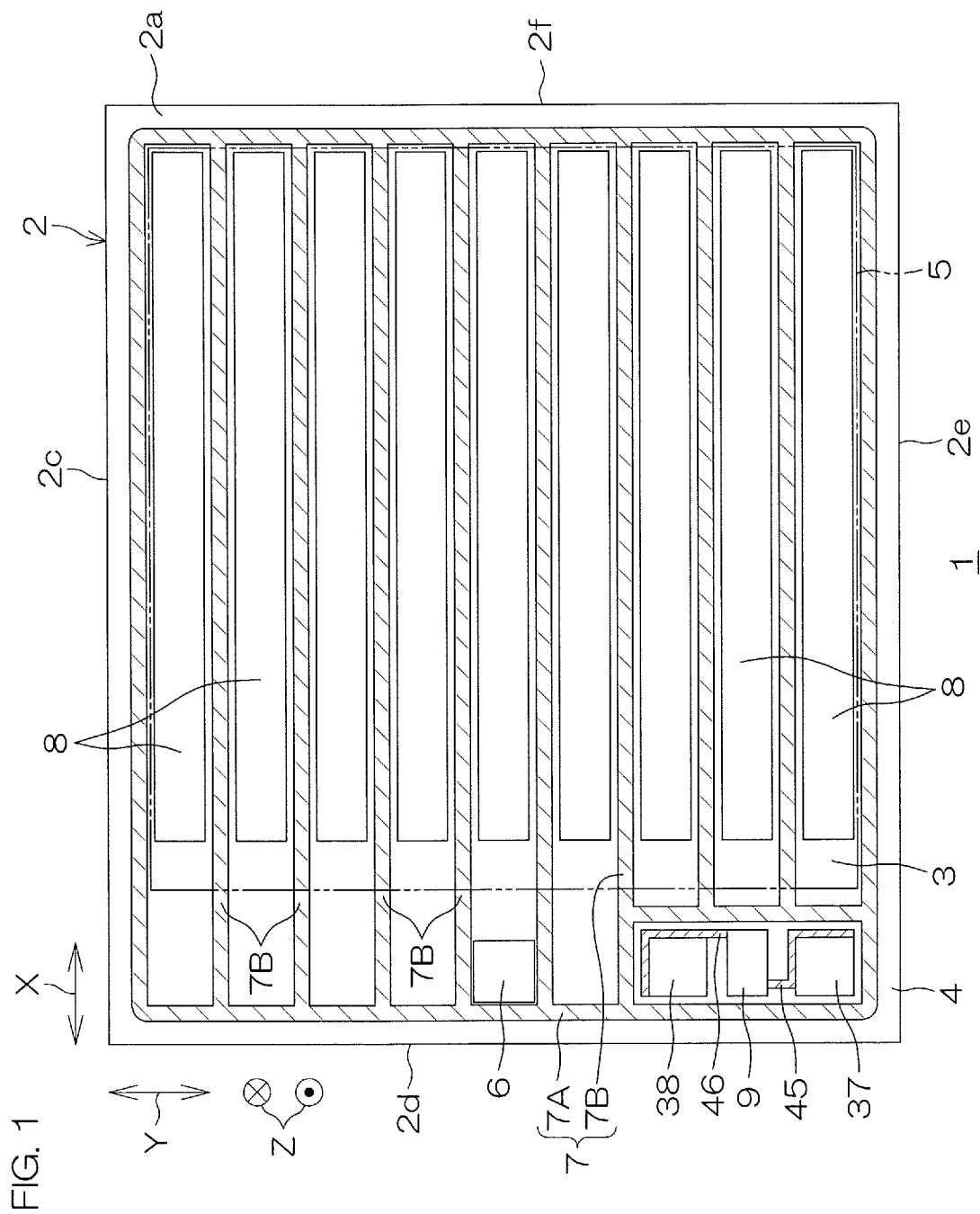
FIG. 1 is a plan view of a semiconductor device according to a preferred embodiment of the present invention.

FIG. 1 is a plan view of a semiconductor device 1 according to a preferred embodiment of the present invention. In this preferred embodiment, the semiconductor device 1 is an electric component having an IGBT (Insulated Gate Bipolar Transistor). IGBT is an example of a power device. The semiconductor device 1 is an example of a discrete device having a power device.

The semiconductor device 1 includes a chip-shaped semiconductor layer 2. The semiconductor layer 2 specifically has a first principal surface 2a on one side and a second principal surface 2b on the other side (see FIG. 3). The first principal surface 2a and the second principal surface 2b are both flat surfaces. FIG. 1 shows a configuration of the semiconductor device 1 in a plan view in a direction perpendicular to the first principal surface 2a. In this preferred embodiment, the first principal surface 2a and the second principal surface 2b have a quadrilateral shape, more specifically, a rectangular shape. The semiconductor layer 2 has side surfaces 2c, 2d, 2e, 2f (four side surfaces in this preferred embodiment) connecting the first principal surface 2a and the second principal surface 2b.

For the purpose of convenience, the direction perpendicular to the first principal surface 2a and the second principal surface 2b, that is, the direction in parallel with a normal line to the first principal surface 2a and the second principal surface 2b will be referred to as a "normal direction Z" of the semiconductor layer 2 in the descriptions below. Also, the view in the normal direction Z will be referred to as a "plan view." Further, for the purpose of convenience, the direction perpendicular to the normal direction Z and in parallel with one (2c) of the side surfaces will be referred to as a "first direction X," while the direction perpendicular to both the normal direction Z and the first direction X (the direction in parallel with the side surface 2d adjacent to the side surface 2c) will be referred to as a "second direction Y."

The semiconductor layer 2 includes an active region 3 and an outer region 4 (peripheral region). The active region 3 and the outer region 4 are defined in the first principal surface 2a of the semiconductor layer 2.

The active region 3 is defined in a central portion of the semiconductor layer 2 in a manner spaced inward from the side surfaces 2c to 2f of the semiconductor layer 2 in a plan view. The active region 3 may be defined in a quadrilateral shape (more specifically, a rectangular shape) having four sides in parallel with the respective four side surfaces 2c to 2f of the semiconductor layer 2 in a plan view.

The outer region 4 is on the outside of the active region 3. The outer region 4 extends zonally along the peripheral edge of the active region 3 in a plan view. The outer region 4 surrounds the active region 3 in a plan view. More specifically, the outer region 4 is defined in an endless shape (quadrilateral annular shape) surrounding the active region 3 in a plan view.

An emitter terminal electrode 5 in a form of a film is disposed so as to cover almost the entire active region 3. In FIG. 1, for the purpose of convenience, the emitter terminal electrode 5 is drawn to have the same shape and size as the active region 3. A gate terminal electrode 6 in a form of a film is disposed in the outer region 4. The gate terminal electrode 6 and the emitter terminal electrode 5 are spaced and thereby electrically insulated from each other. A gate wire 7 is electrically connected to the gate terminal electrode 6. The gate wire 7 has an annular portion 7A formed in the outer region 4 so as to surround the active region 3. The gate wire 7 further includes a gate finger 7B formed in a manner extending from the annular portion 7A toward and across the active region 3. The gate wire 7 is arranged to transmit a gate signal applied to the gate terminal electrode 6 to the active region 3. Multiple gate fingers 7B are formed in a manner extending zonally in the first direction X and spaced from each other in the second direction Y in the active region 3. The gate fingers 7B are disposed below the emitter terminal electrode 5 in a manner insulated from the emitter terminal electrode 5. A cell region 8 is disposed between each pair of the adjacent gate fingers 7B. Power transistor cells 11 are arranged in the cell region 8 (see FIG. 2). Each of the power transistor cells 11 is an example of a semiconductor element or a semiconductor device that generates heat during operation.

A temperature sensitive diode region 9 is further provided in the outer region 4. A temperature sensitive diode sensor 41 composed of a polysilicon diode is formed in the temperature sensitive diode region 9 (See FIG. 4). An anode terminal electrode 37 and a cathode terminal electrode 38 of the temperature sensitive diode sensor 41 (see FIG. 4) are further provided in the outer region 4.

Figure 2:
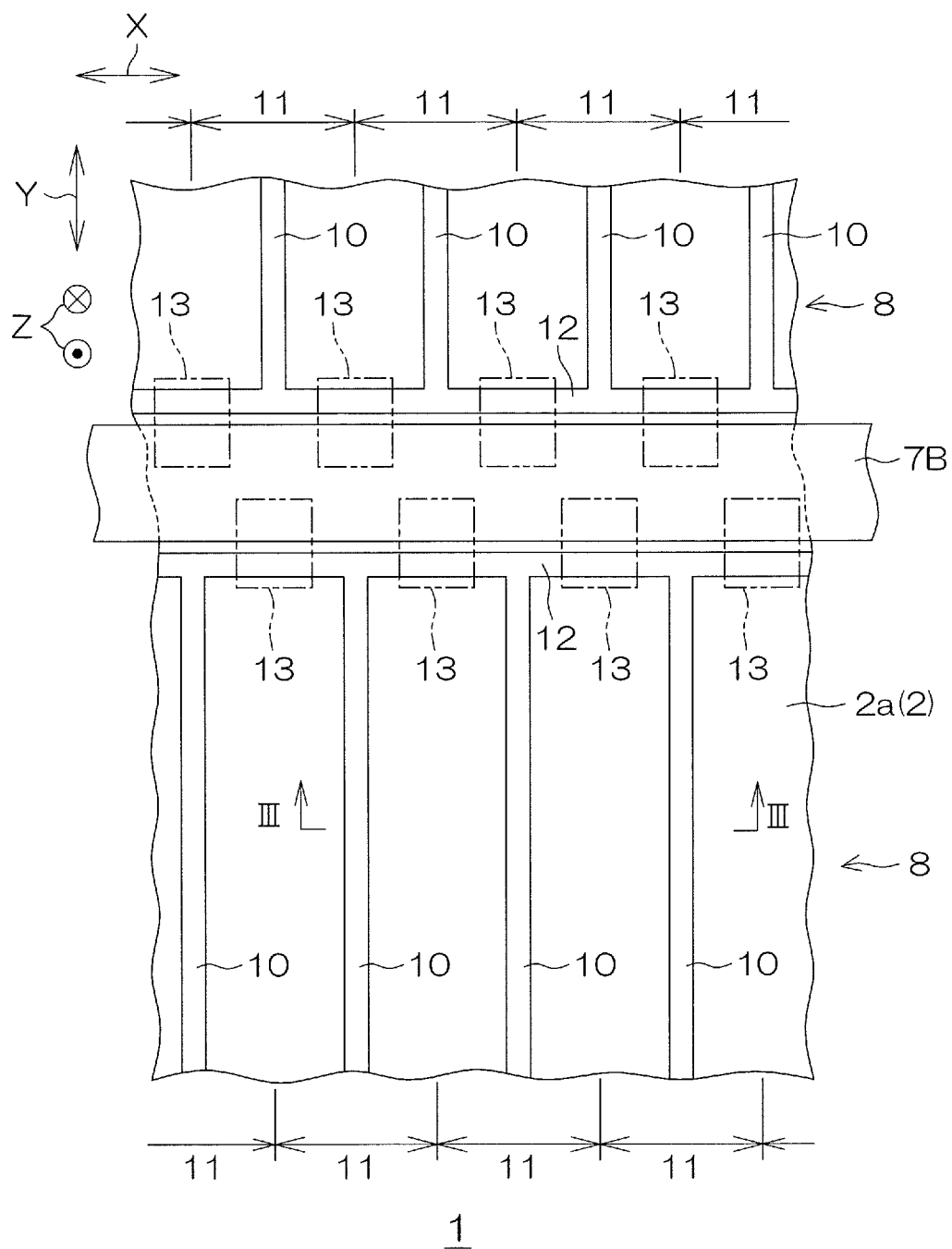
FIG. 2 is an enlarged plan view for illustrating a configuration example of a cell region of the semiconductor device.

FIG. 2 is an enlarged plan view for illustrating a configuration example of a portion of the active region 3, showing the detailed structure of the front surface (first principal surface 2a) of the semiconductor layer 2 in each cell region 8. More precisely, FIG. 2 is an enlarged plan view with description of the emitter terminal electrode 5 as well as an interlayer insulating film, etc., formed on the first principal surface 2a of the semiconductor layer 2 being omitted.

In each cell region 8, multiple power transistor cells 11 are arranged in the first direction X in which the gate fingers 7B extend. More specifically, multiple trench gate structures 10 are formed in the semiconductor layer 2. Each of the trench gate structures 10 extends linearly in the second direction Y, for example. The multiple trench gate structures 10 are formed in parallel with and spaced from each other in the first direction X. The power transistor cells 11 are each defined by, for example, a portion including each one of the trench gate structures 10 within each cell region 8.

The end portions of each trench gate structure 10 are coupled, respectively, to a pair of outer trench gate structures 12 (FIG. 2 shows only the outer trench gate structures 12 on one side). This causes the multiple trench gate structures 10 within each cell region 8 to be connected to each other through the outer trench gate structures 12. The outer trench gate structures 12 extend linearly in the first direction X. The outer trench gate structures 12 are electrically connected through gate lead-out electrode layers 13 composed of polysilicon films to the gate fingers 7B.

Figure 3:
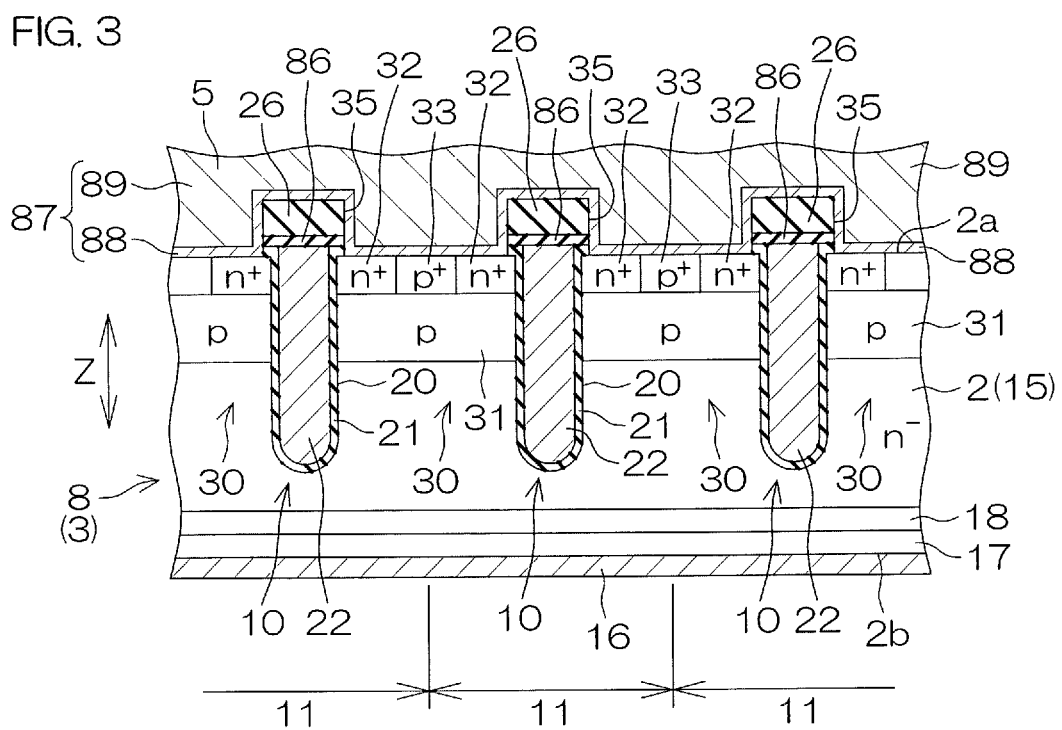
FIG. 3 is a cross-sectional view taken along line III-III in FIG. 2.

FIG. 3 is a cross-sectional view taken along line III-III in FIG. 2, showing an example of a cross-sectional structure in the vicinity of the trench gate structures 10. The semiconductor layer 2 has a single crystal structure including an $n^-$-type semiconductor substrate 15. The semiconductor substrate 15 may be a silicon FZ substrate formed using an FZ (Floating Zone) method. The n-type impurity concentration of the semiconductor substrate 15 may be equal to or higher than $4.0 \times 10^{13}$ cm$^{-3}$ but equal to or lower than $2.0 \times 10^{14}$ cm$^{-3}$. The thickness of the semiconductor substrate 15 may be equal to or greater than 50 μm but equal to or smaller than 200 μm. An example of n-type impurities include phosphorus, arsenic, etc.

A collector electrode 16 is formed on the second principal surface 2b of the semiconductor layer 2. The collector electrode 16 is electrically connected to the second principal surface 2b of the semiconductor layer 2. The collector electrode 16 is in Ohmic contact with the second principal surface 2b of the semiconductor layer 2. The collector electrode 16 is arranged to transmit a collector signal to the active region 3.

A p-type collector region 17 is formed over a surface portion of the second principal surface 2b of the semiconductor layer 2. The p-type impurity concentration of the collector region 17 may be equal to or higher than $1.0 \times 10^{15}$ cm$^{-3}$ but equal to or lower than $1.0 \times 10^{18}$ cm$^{-3}$. The collector region 17 is in Ohmic contact with the collector electrode 16. The collector region 17 may be formed over the entire surface portion of the second principal surface 2b. An example of p-type impurities include boron.

An n-type buffer layer 18 is laminated on the collector region 17. The buffer layer 18 may be formed over the entire surface portion of the second principal surface 2b of the semiconductor layer 2. The n-type impurity concentration of the buffer layer 18 is higher than the n-type impurity concentration of the semiconductor substrate 15.

Each of the trench gate structures 10 includes a gate trench 20, a gate insulating layer 21, and a gate electrode layer 22. The gate trench 20 is formed in the first principal surface 2a of the semiconductor layer 2. More specifically, the gate trench 20 is dug down from the first principal surface 2a to extend in the direction (normal direction Z) perpendicular to the first principal surface 2a to a predetermined depth within the semiconductor layer 2.

The width orthogonal to the longitudinal direction of the gate trench 20 may be equal to or greater than 0.5 μm but equal to or smaller than 3.0 μm (e.g. about 1.2 μm). The width of the gate trench 20 is defined as the width of the gate trench 20 in the first direction X. The width of the gate trench 20 may be equal to or greater than 0.5 μm but equal to or smaller than 1.0 μm, equal to or greater than 1.0 μm but equal to or smaller than 1.5 μm, equal to or greater than 1.5 μm but equal to or smaller than 2.0 μm, equal to or greater than 2.0 μm but equal to or smaller than 2.5 μm, or equal to or greater than 2.5 μm but equal to or smaller than 3.0 μm.

The gate insulating layer 21 is formed as a film along the inner wall of the gate trench 20. The gate insulating layer 21 demarcates a recessed space within the gate trench 20. In this preferred embodiment, the gate insulating layer 21 includes a silicon oxide film. Alternatively or additionally to the silicon oxide film, the gate insulating layer 21 may include a silicon nitride film.

The gate electrode layer 22 is embedded in the gate trench 20 with the gate insulating layer 21 therebetween. More specifically, the gate electrode layer 22 is embedded in the recessed space, which is demarcated by the gate insulating layer 21 in the gate trench 20. A gate signal is transmitted to the gate electrode layer 22. That is, the gate electrode layer 22 is electrically connected to the gate terminal electrode 6 (see FIG. 1).

An FET (Field Effect Transistor) structures 30 are formed on both sides of the trench gate structure 10. Each of the FET structure 30 includes a p-type body region 31 formed over a surface portion of the first principal surface 2a of the semiconductor layer 2. The p-type impurity concentration of the body region 31 may be equal to or higher than $1.0 \times 10^{16}$ cm$^{-3}$ but equal to or lower than $1.0 \times 10^{18}$ cm$^{-3}$. The body region 31 is formed zonally to extend along the trench gate structure 10 in a plan view. The body region 31 is exposed through the side surface of the gate trench 20. The bottom portion of the body region 31 is disposed at a depth position between the first principal surface 2a of the semiconductor layer 2 and the bottom wall of the gate trench 20 in the direction (normal direction Z) perpendicular to the first principal surface 2a.

The FET structure 30 includes an n+-type emitter region 32 formed over a surface portion of the body region 31. The n-type impurity concentration of the emitter region 32 may be equal to or higher than $1.0 \times 10^{19}$ cm$^{-3}$ but equal to or lower than $1.0 \times 10^{21}$ cm$^{-3}$.

The emitter region 32 is formed zonally to extend along the trench gate structure 10 in a plan view. The emitter region 32 is exposed through the first principal surface 2a of the semiconductor layer 2. The emitter region 32 is further exposed through the side surface of the gate trench 20. The bottom portion of the emitter region 32 is disposed at a depth position between the upper end portion of the gate electrode layer 22 and the bottom portion of the body region 31 in the direction (normal direction Z) perpendicular to the first principal surface 2a.

The FET structure 30 includes a p+-type contact region 33 extending from the first principal surface 2a of the semiconductor layer 2 through the emitter region 32 to the body region 31. The p-type impurity concentration of the contact region 33 is higher than the p-type impurity concentration of the body region 31. The p-type impurity concentration of the contact region 33 may be equal to or higher than $1.0 \times 10^{19}$ cm$^{-3}$ but equal to or lower than $1.0 \times 10^{20}$ cm$^{-3}$.

The contact region 33 is positioned so as to sandwich the emitter region 32 with the trench gate structure 10. The contact region 33 is exposed through the first principal surface 2a of the semiconductor layer 2.

The FET structure 30 is configured so that the gate electrode layer 22 opposes the body region 31 and the emitter region 32 with the gate insulating layer 21 therebetween. An IGBT channel is formed in a region of the body region 31 opposing the gate trench 20. The channel is controlled ON/OFF by a gate signal.

A principal surface insulating layer 25 is formed on the first principal surface 2a of the semiconductor layer 2. The principal surface insulating layer 25 is formed as a film along the first principal surface 2a. The principal surface insulating layer 25 continues to the gate insulating layer 21. In this preferred embodiment, the principal surface insulating layer 25 includes a silicon oxide film. Alternatively or additionally to the silicon oxide film, the principal surface insulating layer 25 may include a silicon nitride film.

An interlayer insulating layer 26 is formed on the principal surface insulating layer 25. The interlayer insulating layer 26 is formed as a film along the first principal surface 2a of the semiconductor layer 2. The interlayer insulating layer 26 may include silicon oxide or silicon nitride. The interlayer insulating layer 26 may include PSG (Phosphor Silicate Glass) and/or BPSG (Boron Phosphor Silicate Glass) as an example of the silicon oxide. The interlayer insulating layer 26 may be a laminated film in which a PSG layer and a BPSG layer are laminated in this order from the first principal surface 2a side.

An emitter contact opening 35 is formed in the interlayer insulating layer 26. The emitter region 32 and the contact region 33 are exposed through the emitter contact opening 35 between the adjacent trench gate structures 10.

An emitter terminal electrode 5 is formed on the interlayer insulating layer 26. The emitter terminal electrode 5 may contain at least one type of substance among aluminum, copper, Al—Si—Cu (aluminum-silicon-copper) alloy, Al—Si (aluminum-silicon) alloy, and Al—Cu (aluminum-copper) alloy. The emitter terminal electrode 5 may have a single-layer structure containing one type of substance among the conductive materials. The emitter terminal electrode 5 may have a laminated structure in which at least two types of substances among the conductive materials are laminated in any order.

The emitter terminal electrode 5 enters the emitter contact opening 35 from above the interlayer insulating layer 26. That is, the emitter terminal electrode 5 is electrically connected to the emitter region 32 and the contact region 33 in the emitter contact opening 35.

The gate terminal electrode 6, the anode terminal electrode 37, and the cathode terminal electrode 38, shown in FIG. 1, are also formed on the interlayer insulating layer 26. These may be formed of the same conductive material as the emitter terminal electrode 5.

Figure 4:
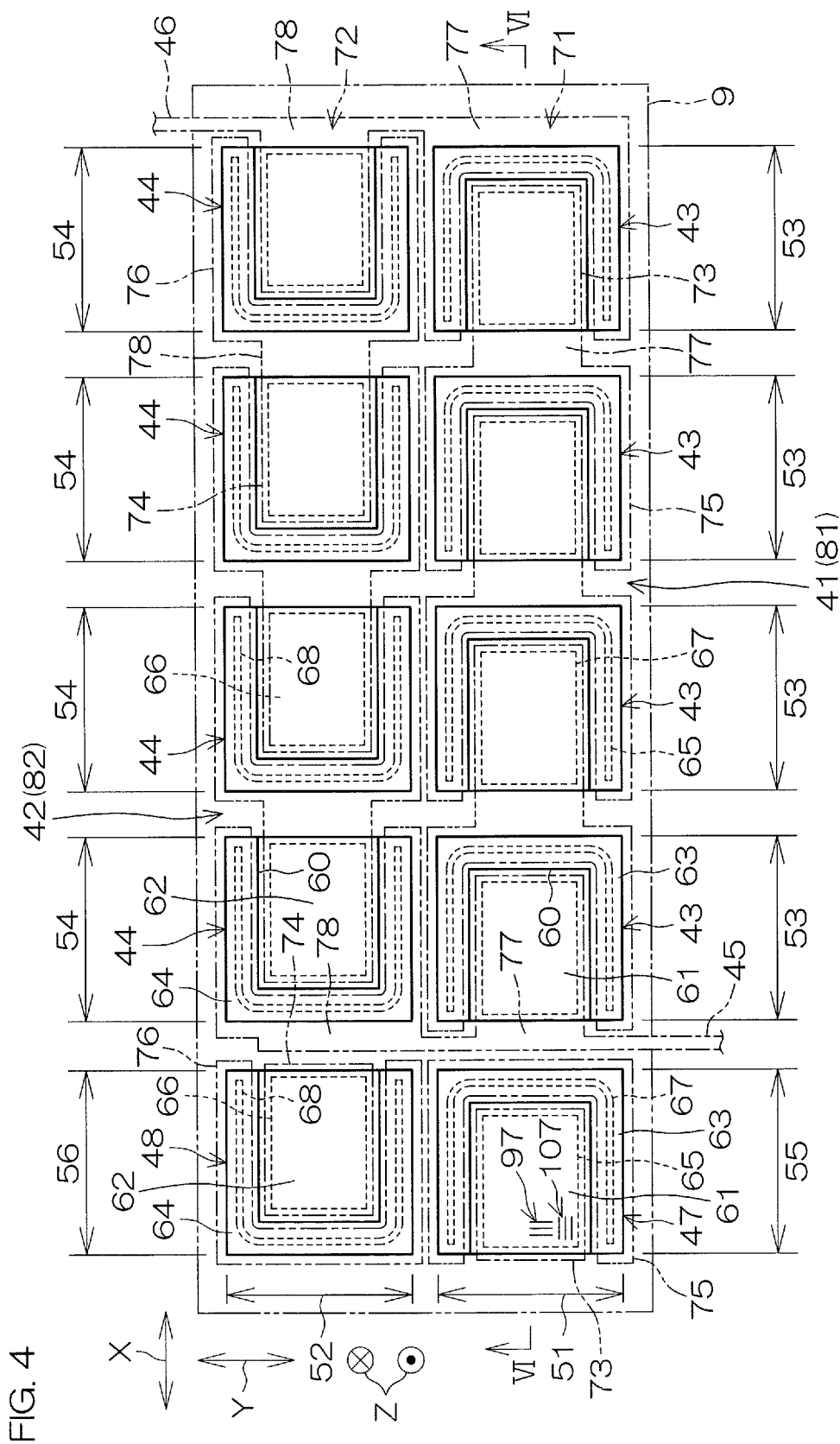
FIG. 4 is an enlarged plan view for illustrating a configuration example of a temperature sensitive diode region.
Figure 5:
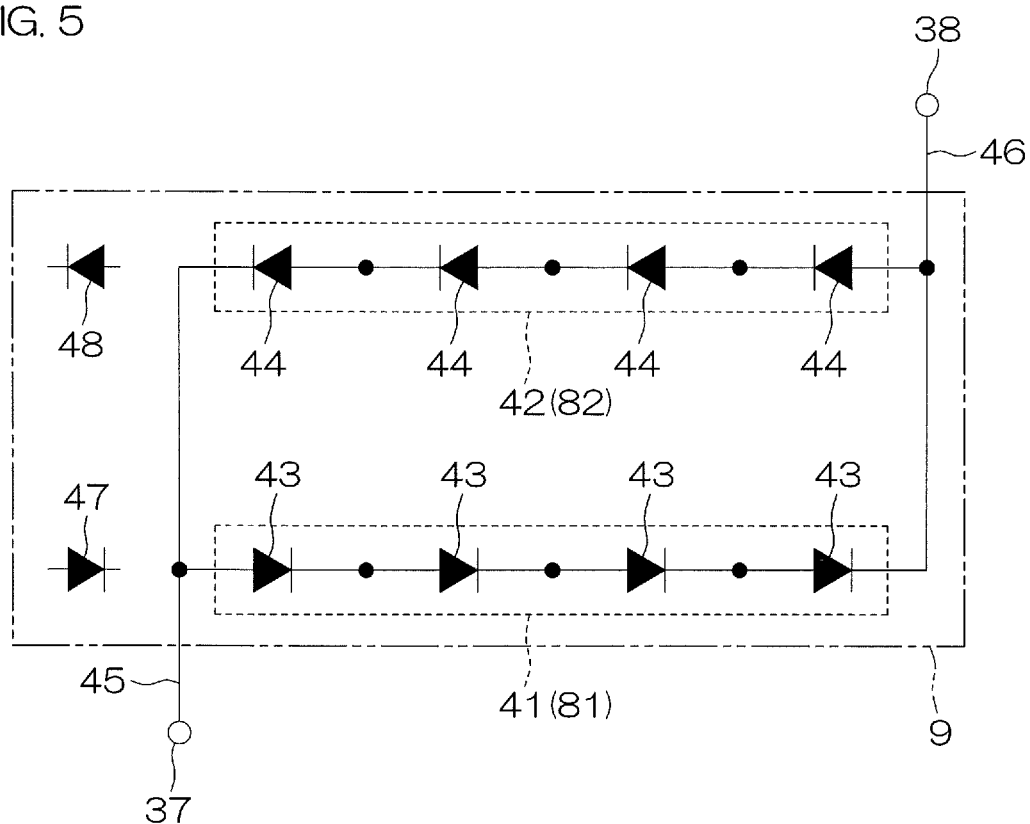
FIG. 5 is an electrical circuit diagram showing an electrical configuration of the temperature sensitive diode region.
Figure 6:
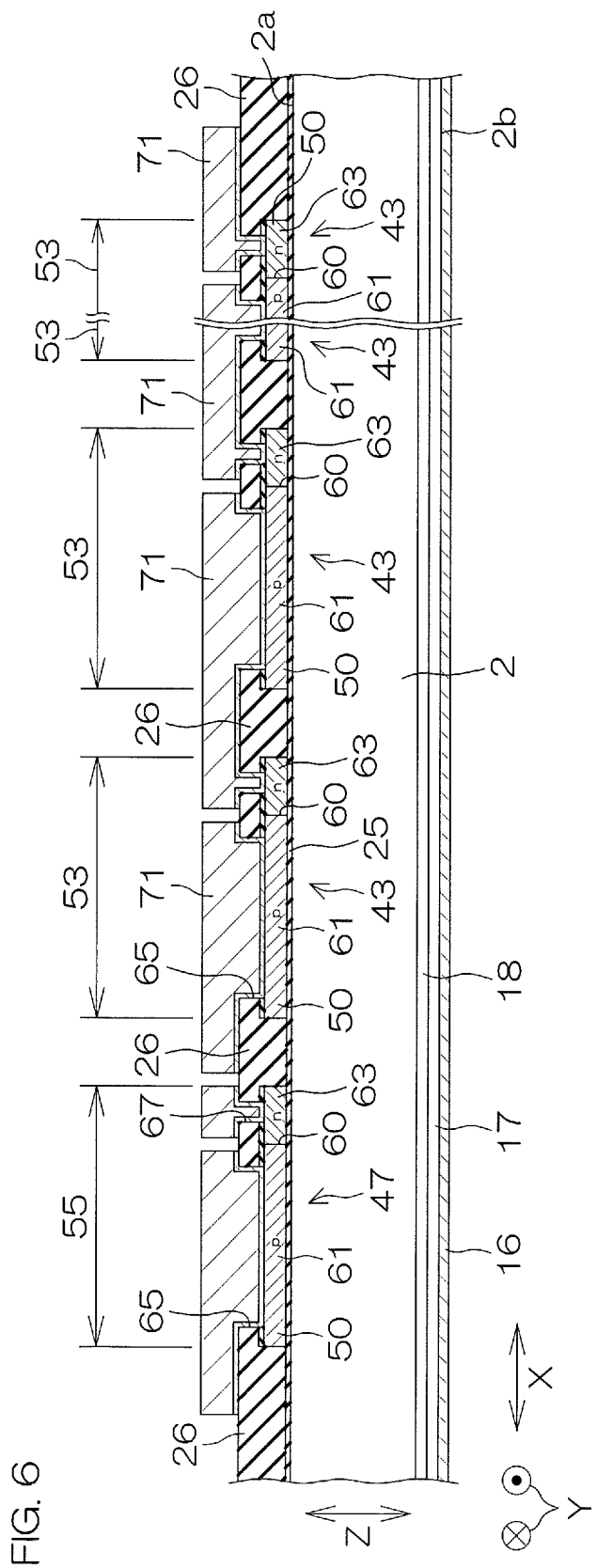
FIG. 6 is a cross-sectional view showing a structure example taken along line VI-VI in FIG. 4.

FIG. 4 is an enlarged plan view for illustrating a configuration example of the temperature sensitive diode region 9 and FIG. 5 is an electrical circuit diagram showing an electrical configuration of the temperature sensitive diode region 9. FIG. 6 is a cross-sectional view showing a structure example taken along line VI-VI in FIG. 4.

The temperature sensitive diode region 9 includes a temperature sensitive diode sensor 41 and a protective device or protective element 42. The temperature sensitive diode sensor 41 includes a first series circuit 81 composed of an array of multiple first diodes 43 that are connected in series in the forward direction. Each of the first diodes 43 is an example of a sensor diode. The multiple first diodes 43 are arranged to form a linear array. The protective element 42 includes a second series circuit 82 composed of an array of multiple second diodes 44 that are connected in series in the forward direction. Each of the second diodes 44 is an example of a protective diode. The multiple second diodes 44 are arranged to form a linear array. The array of the first diodes 43 and the array of the second diodes 44 are in parallel with each other. The temperature sensitive diode sensor 41 and the protective element 42 are connected in parallel in the reverse direction. Specifically, the first series circuit 81 of the multiple first diodes 43 composing the temperature sensitive diode sensor 41 and the second series circuit 82 of the multiple second diodes 44 composing the protective element 42 are connected in parallel with the first diodes 43 and the second diodes 44 in mutually reverse directions. The thus configured parallel circuit is connected to the anode terminal electrode 37 (see FIG. 1) through a first terminal wire 45 and connected to the cathode terminal electrode 38 (see FIG. 1) through a second terminal wire 46.

The temperature sensitive diode region 9 further includes dummy diodes 47, 48 that are electrically isolated from both the temperature sensitive diode sensor 41 and the protective element 42. In this preferred embodiment, a first dummy diode 47 and a second dummy diode 48 are provided. The first dummy diode 47 is disposed so as to form a linear array together with the first diodes 43 composing the temperature sensitive diode sensor 41. The first dummy diode 47 is disposed at one end of the array. The second dummy diode 48 is disposed so as to form a linear array together with the second diodes 44 composing the protective element 42. The second dummy diode 48 is disposed at one end of the array. In this preferred embodiment, the first dummy diode 47 and the second dummy diode 48 are disposed adjacent to each other.

The dummy diodes 47, 48 are formed mainly to fill an empty space within the temperature sensitive diode region 9.

The dummy diodes 47, 48 are thus provided to allow for accurate formation of the first diodes 43 and the second diodes 44 that respectively compose the temperature sensitive diode sensor 41 and the protective element 42.

As shown in FIG. 6, the temperature sensitive diode sensor 41 includes a polysilicon layer 50 formed on the first principal surface 2a of the semiconductor layer 2. The temperature sensitive diode sensor 41 is formed by selectively introducing n-type impurities and p-type impurities into the polysilicon layer 50.

More specifically, the polysilicon layer 50 is formed on the principal surface insulating layer 25. The polysilicon layer 50 is electrically insulated from the semiconductor layer 2 by the principal surface insulating layer 25. The thickness of the polysilicon layer 50 may be equal to or greater than 0.2 μm but equal to or smaller than 1.0 μm.

As shown in FIG. 4, in this preferred embodiment, the polysilicon layer 50 has a longitudinally rectangular shape extending in the first direction X. A first circuit forming region 51 and a second circuit forming region 52 are defined in the polysilicon layer 50. The first circuit forming region 51 and the second circuit forming region 52 are defined in a manner spaced from each other in the lateral direction of the polysilicon layer 50 and extend in parallel in the longitudinal direction of the polysilicon layer 50.

In this preferred embodiment, the first circuit forming region 51 includes multiple (four in this preferred embodiment) first diode forming regions 53 and a first dummy diode forming region 55. The first diodes 43 are formed in the first diode forming regions 53. The first dummy diode 47 is formed in the first dummy diode forming regions 55. The multiple first diode forming regions 53 and the first dummy diode forming region 55 are defined in a manner spaced (equally in this preferred embodiment) from each other in the longitudinal direction (the first direction X in this preferred embodiment) of the polysilicon layer 50.

In this preferred embodiment, each of the first diode forming regions 53 and the first dummy diode forming region 55 is defined in a quadrilateral shape in a plan view.

In this preferred embodiment, the second circuit forming region 52 includes multiple (four in this preferred embodiment) second diode forming regions 54 and a second dummy diode forming region 56. The second diodes 44 are formed in the second diode forming regions 54. The second dummy diode 48 is formed in the second dummy diode forming regions 56. The multiple second diode forming regions 54 and the second dummy diode forming region 56 are defined in a manner spaced from each other in the longitudinal direction (the first direction X in this preferred embodiment) of the polysilicon layer 50.

In this preferred embodiment, each of the second diode forming regions 54 and the second dummy diode forming region 56 is defined in a quadrilateral shape in a plan view.

Figure 7:
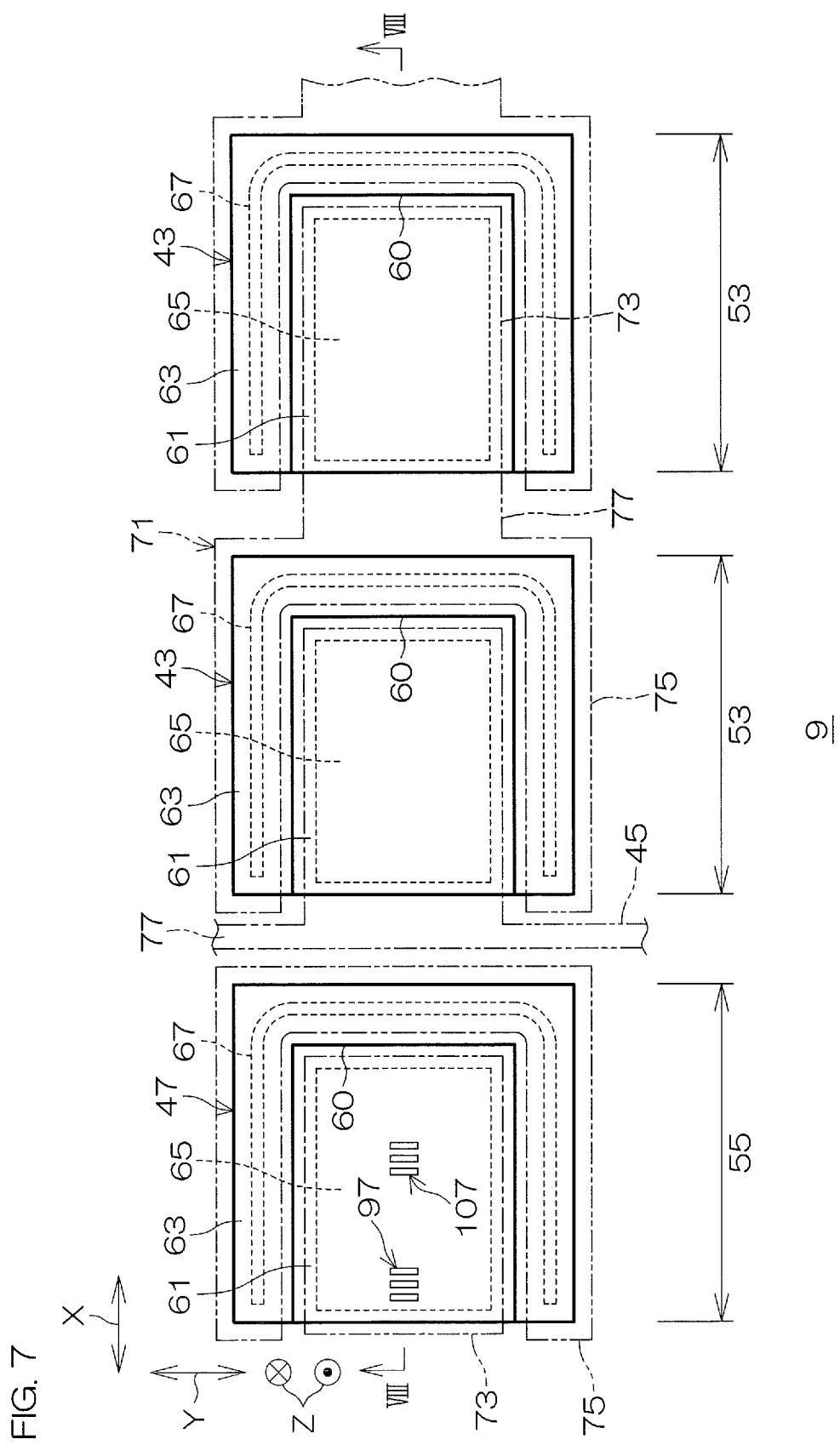
FIG. 7 is an enlarged plan view of a diode forming region.
Figure 8:
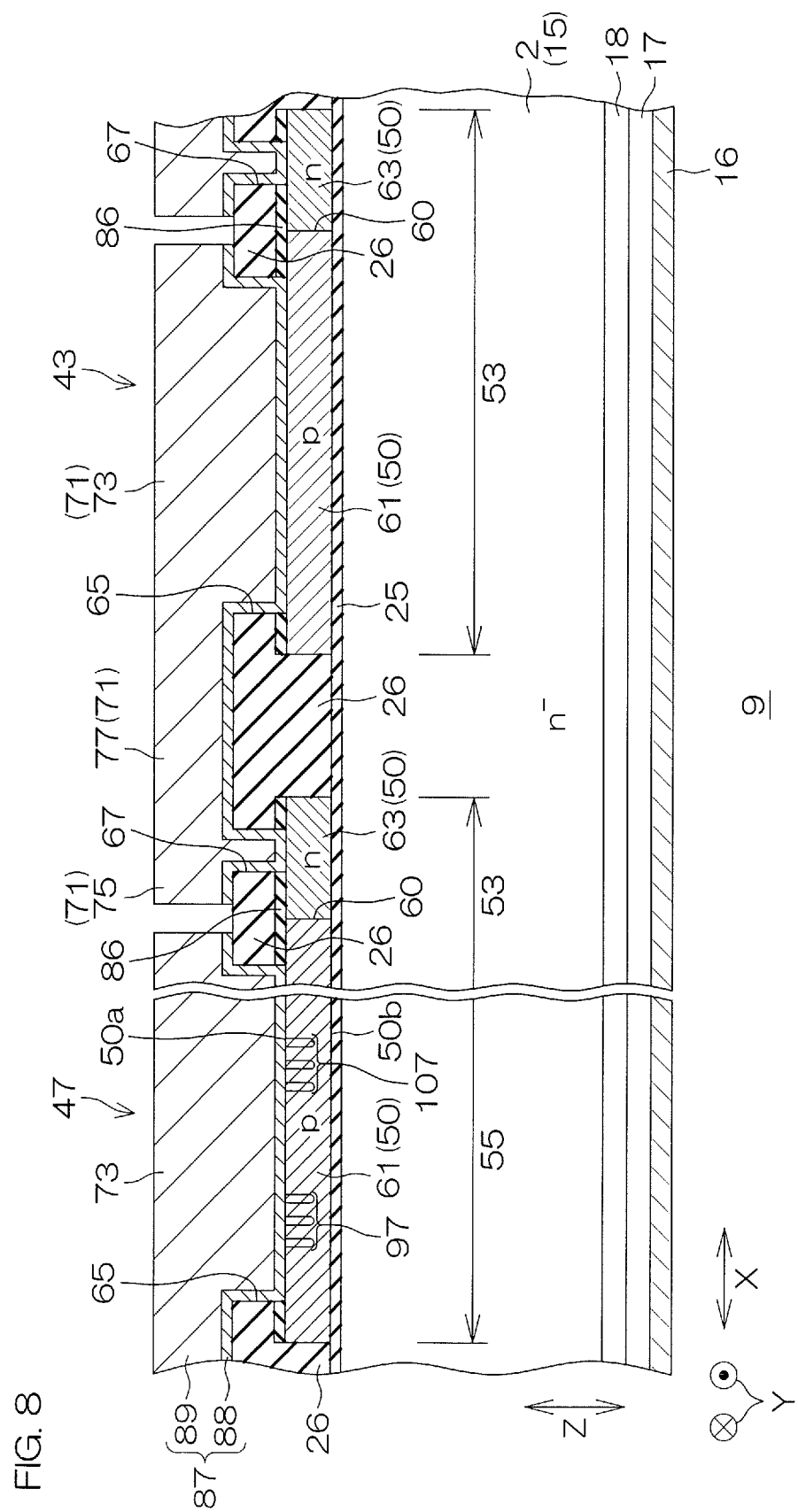
FIG. 8 is an enlarged cross-sectional view of the diode forming region.

FIG. 7 is an enlarged plan view of the first dummy diode 47 and some of the first diodes 43 and FIG. 8 shows an enlarged cross-sectional structure taken along line VIII-VIII in FIG. 7. Each of the first diode forming regions 53 and the first dummy diode forming region 55 is formed with a p-type first anode region 61 and an n-type first cathode region 63. The first anode region 61 is formed in a central portion of each of the first diode forming regions 53 and the first dummy diode forming region 55. In this preferred embodiment, the first anode region 61 is exposed through a first surface 50a and a second surface 50b of the polysilicon layer 50.

In this preferred embodiment, the first anode region 61 is formed in an approximately rectangular shape in a plan view. The first anode region 61 may have any planar shape. The first anode region 61 may be formed in a polygonal shape such as a triangular shape or a hexagonal shape, a circular shape, or an elliptical shape in a plan view.

The first cathode region 63 is formed along the peripheral edge of the first anode region 61. In this preferred embodiment, the first cathode region 63 is formed in a C shape or a U shape surrounding the first anode region 61 in a plan view. The first cathode region 63 may be formed in an annular shape surrounding the entire first anode region 61. The first cathode region 63 is electrically connected to the first anode region 61.

In this preferred embodiment, the first cathode region 63 is exposed through a first surface 50a and a second surface 50b of the polysilicon layer 50. The first cathode region 63 is connected to the first anode region 61 throughout the entire thickness direction of the polysilicon layer 50. A pn junction portion 60 is formed at an interface between the first cathode region 63 and the first anode region 61. In this preferred embodiment, since the first cathode region 63 is formed in a C shape or a U shape so as to surround the first anode region 61, the pn junction portion 60 also has a C shape or a U shape in a plan view. If the first cathode region 63 annularly surrounds and is in contact with the entire first anode region 61, the pn junction portion 60 accordingly has an annular shape in a plan view.

One first diode 43 is thus formed in each first diode forming region 53 with the first anode region 61 serving as an anode and the first cathode region 63 serving as a cathode. Also in the first dummy diode forming region 55, the first dummy diode 47 is formed to have the first anode region 61 and the first cathode region 63. Note here that the first dummy diode 47 has no electrical function, as mentioned above.

The structure of the second diode forming regions 54 and the second dummy diode forming region 56 is substantially the same as the structure of the first diode forming regions 53 and the first dummy diode forming region 55, respectively. Note here that as can be seen in FIG. 4, the second diode forming region 54 has a structure as a result of mirror inversion of each first diode forming region 53 at a middle portion of a rectangular region including the multiple first diode forming regions 53 in the direction (first direction X) in which the multiple first diodes 43 are arranged. Similarly, the second dummy diode forming region 56 has a structure as a result of mirror inversion of the first dummy diode forming region 55 at a middle portion of the first dummy diode forming region 55 in the direction (first direction X) in which the multiple first diodes 43 are arranged.

Specifically, each of the second diode forming regions 54 and the second dummy diode forming region 56 is formed with a p-type second anode region 62 and an n-type second cathode region 64. The second anode region 62 is formed in a central portion of each of the second diode forming regions 54 and the second dummy diode forming region 56. In this preferred embodiment, the second anode region 62 is exposed through a first surface 50a and a second surface 50b of the polysilicon layer 50.

In this preferred embodiment, the second anode region 62 is formed in an approximately rectangular shape in a plan view. The second anode region 62 may have any planar shape. The second anode region 62 may be formed in a polygonal shape such as a triangular shape or a hexagonal shape, a circular shape, or an elliptical shape in a plan view.

The second cathode region 64 is formed along the peripheral edge of the second anode region 62. In this preferred embodiment, the second cathode region 64 is formed in a C shape or a U shape surrounding the second anode region 62 in a plan view. The second cathode region 64 may be formed in an annular shape surrounding the entire second anode region 62. The second cathode region 64 is electrically connected to the second anode region 62.

In this preferred embodiment, the second cathode region 64 is exposed through the first surface 50a and the second surface 50b of the polysilicon layer 50. The second cathode region 64 is connected to the second anode region 62 throughout the entire thickness direction of the polysilicon layer 50. A pn junction portion 60 is formed between the second cathode region 64 and the second anode region 62. In this preferred embodiment, since the second cathode region 64 is formed in a C shape or a U shape so as to surround the second anode region 62, the pn junction portion 60 also has a C shape or a U shape in a plan view. If the second cathode region 64 annularly surrounds and is in contact with the entire second anode region 62, the pn junction portion 60 accordingly has an annular shape in a plan view.

Each of the second diodes 44 is thus formed in each second diode forming region 54 with the second anode region 62 serving as an anode and the second cathode region 64 serving as a cathode. Also in the second dummy diode forming region 56, the second dummy diode 48 is formed to have the second anode region 62 and the second cathode region 64. Note here that the second dummy diode 48 has no electrical function, as mentioned above.

Referring to FIGS. 6 and 8, the above-mentioned interlayer insulating layer 26 covers the polysilicon layer 50. A first anode opening 65 and a first cathode opening 67 are formed in a portion of the interlayer insulating layer 26 covering each first diode forming region 53.

The first anode region 61 is exposed through the first anode opening 65. The first anode opening 65 is formed in a manner penetrating the interlayer insulating layer 26. As shown in FIGS. 4 and 7, in this preferred embodiment, the first anode opening 65 is formed in an approximately rectangular shape in a plan view. As a matter of course, the first anode opening 65 may have any planar shape, not only a rectangular shape but any polygonal shape, a circular shape, or an elliptical shape. The first anode opening 65 may also extend zonally along the peripheral edge of the first anode region 61 in a plan view. In this case, the first anode opening 65 may have an annular shape such as a circular shape, an elliptical shape, or a polygonal shape in a plan view. Further, multiple first anode openings 65 may be formed in a manner spaced from each other in each of the first diode forming regions 53.

The first cathode region 63 of each first diode forming region 53 is exposed through the first cathode opening 67. The first cathode opening 67 is formed in a manner penetrating the interlayer insulating layer 26. As shown in FIGS. 4 and 7, the first cathode opening 67 extends zonally along the peripheral edge of the first anode region 61 in a plan view. The first cathode opening 67 is formed in a C shape or a U shape in a plan view. The first cathode opening 67 may have any planar shape without limitation to a C shape or a U shape. The first cathode opening 67 may be formed in a polygonal shape such as a triangular shape, a quadrilateral shape, or a hexagonal shape, or an elliptical shape in a plan view. Multiple first cathode openings 67 may also be formed in a manner spaced from each other in each first diode forming region 53.

A second anode opening 66 and a second cathode opening 68 are formed in a portion of the interlayer insulating layer 26 covering each second diode forming region 54.

The second anode region 62 is exposed through the second anode opening 66. The second anode opening 66 is formed in a manner penetrating the interlayer insulating layer 26. In this preferred embodiment, the second anode opening 66 is formed in an approximately rectangular shape in a plan view. As a matter of course, the second anode opening 66 may have any planar shape, not only a rectangular shape but any polygonal shape, a circular shape, or an elliptical shape. The second anode opening 66 may also extend zonally along the peripheral edge of the second anode region 62 in a plan view. In this case, the second anode opening 66 may have an annular shape such as a circular shape, an elliptical shape, or a polygonal shape in a plan view. Further, multiple second anode openings 66 may be formed in a manner spaced from each other in each of the second diode forming regions 54.

The second cathode region 64 of each second diode forming region 54 is exposed through the second cathode opening 68. The second cathode opening 68 is formed in a manner penetrating the interlayer insulating layer 26. The second cathode opening 68 extends zonally along the peripheral edge of the second anode region 62 in a plan view. The second cathode opening 68 is formed in a C shape or a U shape in a plan view. The second cathode opening 68 may have any planar shape without limitation to a C shape or a U shape. The second cathode opening 68 may be formed in a polygonal shape such as a triangular shape, a quadrilateral shape, or a hexagonal shape, or an elliptical shape in a plan view. Multiple second cathode openings 68 may also be formed in a manner spaced from each other in each second diode forming region 54.

A first diode wire 71 is formed on a portion of the interlayer insulating layer 26 covering the first circuit forming region 51 (see FIG. 4). The first diode wire 71 connects the multiple first diodes 43 in series in the forward direction between a first terminal wire 45 and a second terminal wire 46. The first diode wire 71 has one end portion connected to the first terminal wire 45 and the other end portion connected to the second terminal wire 46.

The first diode wire 71 may contain at least one type of substance among aluminum, copper, Al—Si—Cu (aluminum-silicon-copper) alloy, Al—Si (aluminum-silicon) alloy, and Al—Cu (aluminum-copper) alloy.

More specifically, the first diode wire 71 includes multiple first anode electrodes 73, multiple first cathode electrodes 75, and multiple first connection electrodes 77.

Each of the first anode electrodes 73 is formed on a portion of the interlayer insulating layer 26 covering each first diode forming region 53. The first anode electrode 73 is formed in an approximately rectangular shape in a plan view. The first anode electrode 73 has any planar shape. The first anode electrode 73 may be formed in a polygonal shape such as a triangular shape, a quadrilateral shape, or a hexagonal shape, a circular shape, or an elliptical shape in a plan view. The first anode electrode 73 enters the first anode opening 65 from above the interlayer insulating layer 26. The first anode electrode 73 is electrically connected to the first anode region 61 within the first anode opening 65.

Each of the first cathode electrodes 75 is formed on a portion of the interlayer insulating layer 26 covering each first diode forming region 53. The first cathode electrode 75 extends zonally along the first anode electrode 73 in a plan view. In this preferred embodiment, the first cathode electrode 75 is formed in a C shape or a U shape in a plan view. The first cathode electrode 75 may have any planar shape without limitation to a C shape or a U shape. The first cathode electrode 75 may be formed in a polygonal shape such as a triangular shape, a quadrilateral shape, or a hexagonal shape, a circular shape, or an elliptical shape in a plan view. The first cathode electrode 75 enters the first cathode opening 67 from above the interlayer insulating layer 26. The first cathode electrode 75 is electrically connected to the first cathode region 63 within the first cathode opening 67.

Each of the first connection electrodes 77 is formed on a portion of the interlayer insulating layer 26 covering a region between a pair of the mutually adjacent first diode forming regions 53. The first connection electrode 77 is drawn from the first cathode electrode 75 of one of the first diode forming regions 53 and connected to the first anode electrode 73 of the other first diode forming region 53. In this preferred embodiment, the first connection electrode 77 is formed zonally to extend in the longitudinal direction (the first direction X in this preferred embodiment) of the polysilicon layer 50 in a plan view. The first connection electrode 77 may be routed linearly in a region between a pair of the mutually adjacent first diode forming regions 53.

One of the first connection electrodes 77 positioned on one end portion side in the longitudinal direction of the polysilicon layer 50 is connected to the first terminal wire 45. One of the first connection electrodes 77 positioned on the other end portion side in the longitudinal direction of the polysilicon layer 50 is connected to the second terminal wire 46.

This causes the first series circuit 81 including multiple (four in this preferred embodiment) first diodes 43 that are connected in series in the forward direction to be formed in a region between the first terminal wire 45 and the second terminal wire 46.

One of the first anode electrode 73 and one of the first cathode electrode 75 are also formed in the first dummy diode forming region 55. However, these are connected to neither other diodes nor the terminal wires 45, 46.

A second diode wire 72 is formed on a portion of the interlayer insulating layer 26 covering the second circuit forming region 52. The second diode wire 72 connects the multiple second diodes 44 in series in the forward direction between a first terminal wire 45 and a second terminal wire 46. The second diode wire 72 has one end portion connected to the first terminal wire 45 and the other end portion connected to the second terminal wire 46.

The second diode wire 72 may contain at least one type of substance among aluminum, copper, Al—Si—Cu (aluminum-silicon-copper) alloy, Al—Si (aluminum-silicon) alloy, and Al—Cu (aluminum-copper) alloy.

More specifically, the second diode wire 72 includes multiple second anode electrodes 74, multiple second cathode electrodes 76, and multiple second connection electrodes 78.

Each of the second anode electrodes 74 is formed on a portion of the interlayer insulating layer 26 covering each second diode forming region 54. The second anode electrode 74 is formed in an approximately rectangular shape in a plan view. The second anode electrode 74 has any planar shape. The second anode electrode 74 may be formed in a polygonal shape such as a triangular shape, a quadrilateral shape, or a hexagonal shape, a circular shape, or an elliptical shape in a plan view. The second anode electrode 74 enters the second anode opening 66 from above the interlayer insulating layer 26. The second anode electrode 74 is electrically connected to the second anode region 62 within the second anode opening 66.

Each of the second anode electrodes 76 is formed on a portion of the interlayer insulating layer 26 covering each second diode forming region 54. The second cathode electrode 76 extends zonally along the second anode electrode 74 in a plan view. In this preferred embodiment, the second cathode electrode 76 is formed in a C shape or a U shape in a plan view. The second cathode electrode 76 may have any planar shape without limitation to a C shape or a U shape. The second cathode electrode 76 may be formed in a polygonal shape such as a triangular shape, a quadrilateral shape, or a hexagonal shape, a circular shape, or an elliptical shape in a plan view. The second cathode electrode 76 enters the second cathode opening 68 from above the interlayer insulating layer 26. The second cathode electrode 76 is electrically connected to the second cathode region 64 within the second cathode opening 68.

Each of the second connection electrodes 78 is formed on a portion of the interlayer insulating layer 26 covering a region between the mutually adjacent second diode forming regions 54. The second connection electrode 78 is drawn from the second cathode electrode 76 of one of the second diode forming regions 54 and connected to the second anode electrode 74 of the other second diode forming region 54. In this preferred embodiment, the second connection electrode 78 is formed zonally to extend in the longitudinal direction (the first direction X in this preferred embodiment) of the polysilicon layer 50 in a plan view. The second connection electrode 78 may be routed linearly in a region between a pair of the mutually adjacent second diode forming regions 54.

One of the second connection electrodes 78 positioned on one end portion side in the longitudinal direction of the polysilicon layer 50 is connected to the second terminal wire 46. One of the second connection electrodes 78 positioned on the other end portion side in the longitudinal direction of the polysilicon layer 50 is connected to the first terminal wire 45.

This causes the second series circuit 82 including multiple (four in this preferred embodiment) second diodes 44 that are connected in series in the forward direction to be formed in a region between the first terminal wire 45 and the second terminal wire 46.

One of the second anode electrode 74 and one of the second cathode electrode 76 are also formed in the second dummy diode forming region 56. However, these are connected to neither other diodes nor the terminal wires 45, 46.

As best shown in FIGS. 7 and 8, the pn junction portion 60 is formed between the approximately rectangular first anode region 61 and the first cathode region 63 that is formed in a C shape or a U shape so as to surround the first anode region 61. The forward voltage of each first diode 43 depends on the junction length of the pn junction portion 60. Accordingly, if the junction length of the pn junction portion 60 of each first diode 43 is greater or smaller than a designed value, the forward voltage of the temperature sensitive diode sensor 41 deviates from an intended value. This may result in that the temperature cannot be accurately measured.

One of factors for which the junction length of the pn junction portion 60 deviates from a designed value is the accuracy of a mask used during ion implantation of p-type impurities into the polysilicon layer 50. The mask in this case is typically a photoresist mask. The photoresist mask is formed by exposing a photoresist layer with an exposure machine and developing the thus exposed photoresist. Poor adjustment (e.g. out-of-focus) of the exposure machine can cause a reduction in the accuracy of the photoresist mask. Even if the exposure machine is adjusted carefully, the adjusted state can vary, resulting in poor adjustment during mass production of semiconductor devices.

FIG. 9 shows a pattern example of a photoresist mask 90 applied to p-type impurity ion implantation. The photoresist mask 90 has an opening in a region into which p-type impurity ions are to be implanted. Specifically, the photoresist mask 90 includes a device pattern or element pattern 92 having multiple device openings or element openings 91 that correspond to the p$^+$-type contact regions 33 in the cell region 8. The photoresist mask 90 also includes a diode pattern 94 having multiple diode openings 93 that correspond to the anode regions 61, 62 in the temperature sensitive diode region 9. The p$^+$-type contact regions 33 and the anode regions 61, 62 are therefore formed simultaneously through a step including selective implantation of p-type impurity ions using the photoresist mask 90 as a mask.

The diode pattern 94 includes a sensor pattern 94S corresponding to the first diodes 43 (sensor diodes). The diode pattern 94 also includes a protective pattern 94P corresponding to the second diodes 44 (protective diodes). The diode pattern 94 further includes a dummy pattern 94D corresponding to the dummy diodes 47, 48.

The photoresist mask 90 has a pattern with a line width of about 1 μm in a region corresponding to the cell region 8. Each element opening 91 has, for example, a zonal shape corresponding to each contact region 33. The line width of each element opening 91 corresponds to the line width of each contact region 33, which is, for example, about 1 μm.

On the other hand, the photoresist mask 90 has a pattern with a line width of about 100 μm to 200 μm in a region corresponding to the temperature sensitive diode region 9. For example, each of the diode openings 93 has a rectangular shape with a size corresponding to that of the anode regions 61, 62, where the long sides have a length of 150 μm to 200 μm (e.g. about 170 μm), while the short sides have a length of 120 μm to 170 μm (e.g. about 140 μm). Also, the space between a pair of diode openings 93 adjacent to each other in the first direction X is 50 μm to 100 μm (e.g. 70 μm). Further, the space between a pair of diode openings 93 adjacent to each other in the second direction Y is 50 μm to 110 μm (e.g. 85 μm).

There is thus about 100 to 200 times difference between the line width of the pattern corresponding to the cell region 8 and line width of the pattern corresponding to the temperature sensitive diode region 9. It is therefore necessary to change magnification settings to observe the patterns in the respective regions using a scanning electron microscope (SEM).

Hence, in this preferred embodiment, the photoresist mask 90 has a monitoring pattern 95 within at least one of the multiple diode openings 93.

The monitoring pattern 95 may be disposed within one of the diode openings 93 corresponding to at least one of the first diodes 43. The monitoring pattern 95 may be disposed within one of the diode openings 93 corresponding to at least one of the second diodes 44. As shown in FIG. 9, the monitoring pattern 95 may be disposed within the diode opening 93 corresponding to the first dummy diode 47. The monitoring pattern 95 may be disposed within the diode opening 93 corresponding to the second dummy diode 48. Multiple monitoring patterns 95 may be formed within one of the diode openings 93 or may be formed, respectively, within the multiple diode openings 93.

The monitoring pattern 95 is preferably disposed at a position retracted inward from the opening edge of the diode opening 93 so that the monitoring pattern 95 does not affect the pn junction.

The monitoring pattern 95 has a minuteness, specifically a line width, observable at the same magnification as that of a scanning electron microscope used to observe the pattern in the cell region 8. More specifically, the monitoring pattern 95 has a line width equal to that of the pattern in the cell region 8, that is, a line width of about 1 μm to 5 μm. In the example of FIG. 9, the monitoring pattern 95 includes multiple linear portions 95L formed to have the same width (e.g. about 1.2 μm) and a predetermined length (e.g. about 20 μm) and arranged in parallel with space therebetween (e.g. about 3 μm). While FIG. 9 shows an example in which the straight linear portions 95L extend in the second direction Y, the direction in which the straight linear portions 95L extend can be set arbitrarily within a plane including the first direction X and the second direction Y. For example, the linear portions 95L may extend in the first direction X.

The monitoring pattern 95 may have any shape, not only a straight linear shape but a polygonal shape, a curved shape, a spiral shape, a character shape, etc. Multiple monitoring patterns 95 having their respective different line widths may also be formed within one of the diode openings 93 or may be formed, respectively, within the multiple diode openings 93.

Line width means the width of linear portions of a photoresist pattern in the direction orthogonal to that in which the linear portions extend. If multiple parallel linear portions are formed, either of the width of the linear photoresist portions and the space between the adjacent linear portions can be a line width. That is, if a line-and-space pattern is used as a monitoring pattern, either of the width of the line portions and the width of the space portions can be a line width.

Since the photoresist used to form the monitoring pattern 95 blocks p-type impurity ions, a monitoring impurity pattern 97 having a shape following that of the monitoring pattern 95 is formed in the polysilicon layer 50 below the monitoring pattern 95, as shown in FIGS. 7 and 8. The monitoring impurity pattern 97 includes a p-type impurity non-implanted region into which no p-type impurity ions are implanted through the photoresist composing the monitoring pattern 95 and a p-type impurity implanted region into which p-type impurity ions are implanted through the photoresist of the monitoring pattern 95. The p-type impurity non-implanted region may disappear through a thermal diffusion process after the ion implantation (see FIGS. 11K and 12K) or may remain as a trace, even after the thermal diffusion process, to form the monitoring impurity pattern 97.

In a region corresponding to the element pattern 92, p$^+$-type contact regions 33 (see FIG. 3) are formed at the positions of the element openings 91. The contact regions 33 serve as an example of an element impurity pattern or device impurity pattern.

FIG. 10 shows a pattern example of a photoresist mask 100 applied to n-type impurity ion implantation. The photoresist mask 100 has an opening in a region into which n-type impurity ions are to be implanted. Specifically, the photoresist mask 100 includes a device pattern or element pattern 102 having multiple device openings or element openings 101 that correspond to the n$^+$-type emitter regions 32 in the cell region 8. The photoresist mask 100 also includes a diode pattern 104 having multiple diode openings 103 that correspond to the cathode regions 63, 64 in the temperature sensitive diode region 9. The n$^+$-type emitter regions 32 and the cathode regions 63, 64 are therefore formed simultaneously through a step including selective implantation of n-type impurity ions using the photoresist mask 100 as a mask.

The diode pattern 104 includes a sensor pattern 104S corresponding to the first diodes 43 (sensor diodes). The diode pattern 104 also includes a protective pattern 104P corresponding to the second diodes 44 (protective diodes). The diode pattern 104 further includes a dummy pattern 104D corresponding to the dummy diodes 47, 48.

The photoresist mask 100 has a pattern with a line width of about 1 μm in a region corresponding to the cell region 8. Each element opening 101 has, for example, a zonal shape corresponding to each emitter region 32. The line width of each element opening 101 corresponds to the line width of each emitter region 32, which is, for example, about 1 μm.

On the other hand, the photoresist mask 100 has a pattern with a line width of about 100 μm to 200 μm in a region corresponding to the temperature sensitive diode region 9. For example, the diode openings 103 have a size and shape corresponding to that of the cathode regions 63, 64. That is, in this preferred embodiment, each of the diode openings 103 is in a zone shape having a C or U planar shape. The zonal diode opening 103 has a width of 20 μm to 30 μm (e.g. 25 μm). Also, the space between a pair of diode openings 103 adjacent to each other in the first direction X is 30 μm to 100 μm (e.g. 50 μm). Further, the space between a pair of diode openings 93 adjacent to each other in the second direction Y is 25 μm to 50 μm (e.g. 35 μm).

There is thus about 25 to 100 times difference between the line width of the pattern corresponding to the cell region 8 and line width of the pattern corresponding to the temperature sensitive diode region 9. It is therefore necessary to change magnification settings to observe the patterns in the respective regions using a scanning electron microscope.

Hence, in this preferred embodiment, the photoresist mask 100 has a monitoring pattern 105 in a region surrounded (on three sides in this preferred embodiment) by at least one of the multiple diode openings 103. In other words, the monitoring pattern 105 is provided within a region corresponding to at least one of the multiple anode regions 61, 62.

The monitoring pattern 105 may be formed within a region corresponding to the first anode region 61 of at least one of the first diodes 43. The monitoring pattern 105 may be formed within a region corresponding to the second anode region 62 of at least one of the second diodes 44. As shown in FIG. 10, the monitoring pattern 105 may be formed within a region corresponding to the first anode region 61 of the first dummy diode 47. The monitoring pattern 105 may be formed within a region corresponding to the second anode region 62 of the second dummy diode 48. Multiple monitoring patterns 105 may be formed within a region corresponding to one of the anode regions 61, 62 or may be formed, respectively, within regions corresponding to the multiple anode regions 61, 62.

In this preferred embodiment, the monitoring pattern 105 is formed outside the diode opening 103 and disposed at a position apart outward from the opening edge of the diode opening 103 so that the monitoring pattern 105 does not affect the pn junction. More specifically, in the example of FIG. 10, the monitoring pattern 105 is formed at a position retracted inward from the outer edge of a region corresponding to the anode regions 61, 62.

The monitoring pattern 105 has a minuteness or a line width observable at the same magnification as that of a scanning electron microscope used to observe the pattern in the cell region 8. More specifically, the monitoring pattern 105 has a line width equal to that of the pattern in the cell region 8, that is, a line width of about 1 μm to 5 μm. In the example of FIG. 10, the monitoring pattern 105 includes multiple linear opening portions 105L formed to have the same width (e.g. about 1.2 μm) and a predetermined length (e.g. about 20 μm) and arranged in parallel with space therebetween (e.g. about 3 μm). While FIG. 10 shows an example in which the straight linear opening portions 105L extend in the second direction Y, the direction in which the straight linear opening portions 105L extend can be set arbitrarily within a plane including the first direction X and the second direction Y. For example, the linear opening portions 105L may extend in the first direction X.

The monitoring pattern 105 may have any shape, not only a straight linear shape but a polygonal shape, a curved shape, a spiral shape, a character shape, etc. Multiple monitoring patterns 105 having their respective different line widths may also be formed within a region corresponding to one of the anode regions 61, 62 or may be formed, respectively, within regions corresponding to the multiple anode regions 61, 62.

Since the linear opening portions 105L of the monitoring pattern 105 allows n-type impurity ions to pass therethrough, a monitoring impurity pattern 107 having a shape following that of the monitoring pattern 105 is formed in the polysilicon layer 50 below the monitoring pattern 105, as shown in FIGS. 7 and 8. The monitoring impurity pattern 107 includes an n-type impurity implanted region into which n-type impurity ions are implanted through the linear opening portions 105L of the monitoring pattern 105 and an n-type impurity non-implanted region into which no n-type impurity ions are implanted through the photoresist between the opening portions. The n-type impurity non-implanted region may disappear through a thermal diffusion process after the ion implantation (FIGS. 11K and 12K) or may remain as a trace, even after the thermal diffusion process, to form the monitoring impurity pattern 107.

The monitoring patterns 95, 105 provided in the respective photoresist masks 90, 100 may be formed in a mutually overlapped position, but may preferably be formed in positions apart from each other, whereby the monitoring impurity patterns 97, 107 can be confirmed individually as appropriate.

In a region corresponding to the element pattern 102, n$^+$-type emitter regions 32 are formed at the positions of the element openings 101. The emitter regions 32 serve as an example of an element impurity pattern or device opening pattern.

FIGS. 11A to 11M and 12A to 12M are cross-sectional views of a main portion for illustrating a method for manufacturing a semiconductor device 1. FIGS. 11A to 11M show a cross-sectional structure of a temperature sensitive diode region 9 in multiple manufacturing steps and FIGS. 12A to 12M show a cross-sectional structure of a cell region 8 corresponding to the respective steps. Note here that FIGS. 11A to 11M and FIGS. 12A to 12M are not necessarily drawn at the same scale.

Figure 11A:
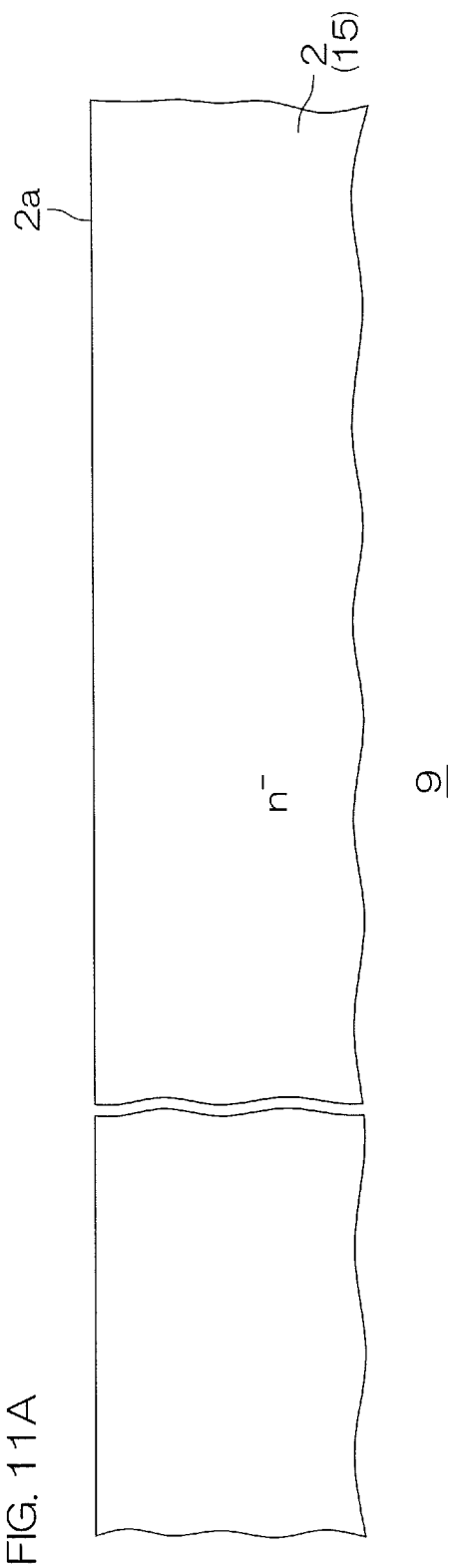
FIG. 11A is a cross-sectional view of a main portion for illustrating a method for manufacturing a semiconductor device.
Figure 12A:
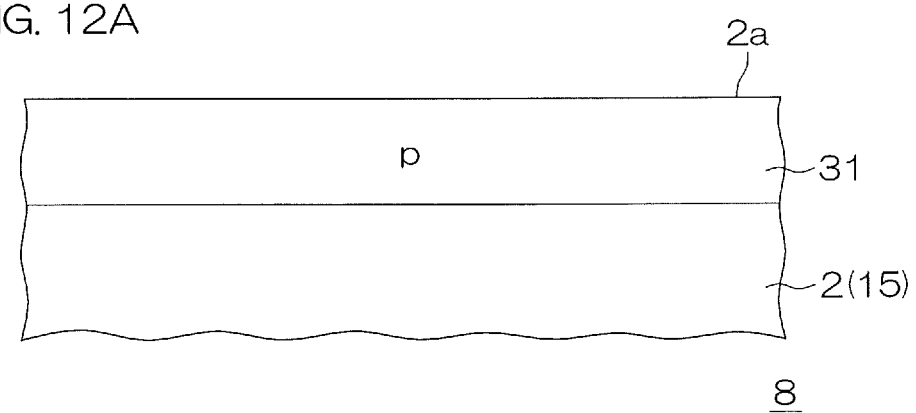
FIG. 12A is a cross-sectional view of a main portion for illustrating the method for manufacturing a semiconductor device.

As shown in FIGS. 11A and 12A, a p-type body region 31 is formed over a surface portion of a first principal surface 2a side of a semiconductor layer 2. Specifically, the p-type body region 31 is formed through selective implantation of p-type impurity ions into the semiconductor layer 2 and thereafter thermal processing.

Figure 12B:
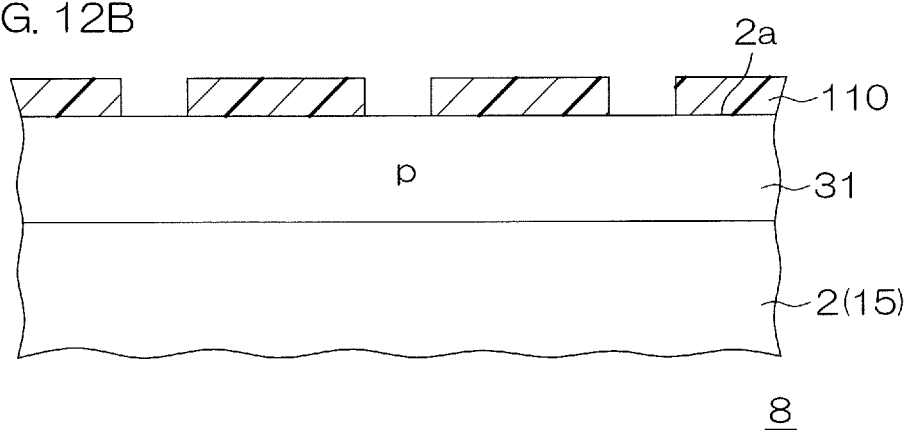
FIG. 12B is a cross-sectional view of a main portion for illustrating the method for manufacturing a semiconductor device.

Next, as shown in FIGS. 11B and 12B, a hard mask 110 having an opening corresponding to a gate trench 20 is formed on the first principal surface 2a of the semiconductor layer 2. The hard mask 110 is formed using, for example, a CVD (chemical vapor deposition) method and composed of a silicon oxide film.

Figure 11C:
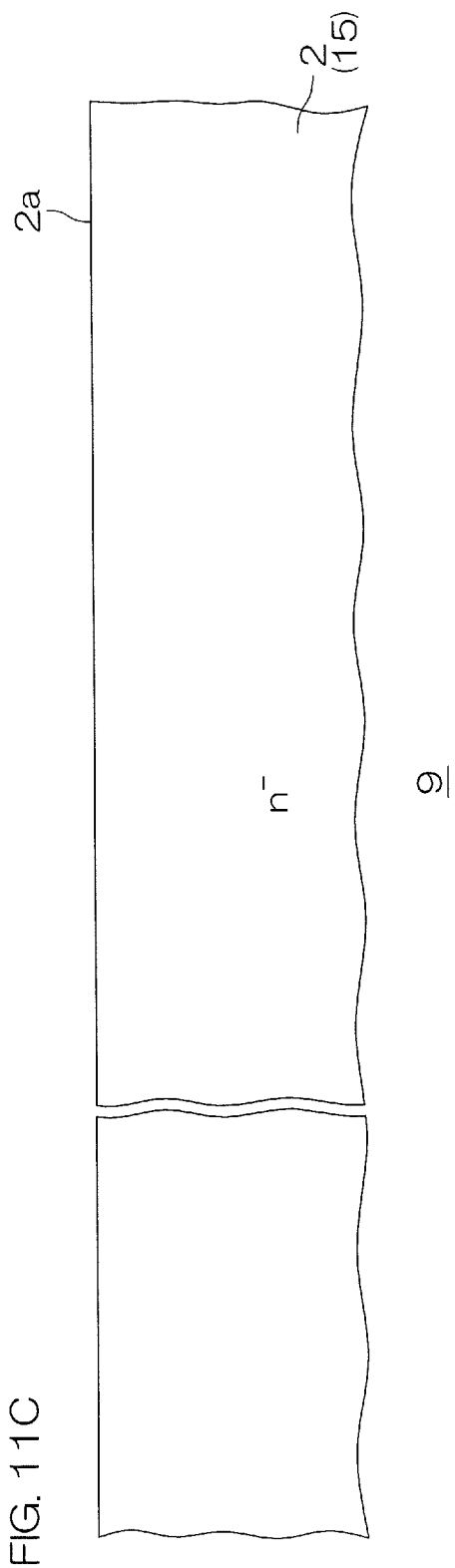
FIG. 11C is a cross-sectional view of a main portion for illustrating the method for manufacturing a semiconductor device.
Figure 12C:
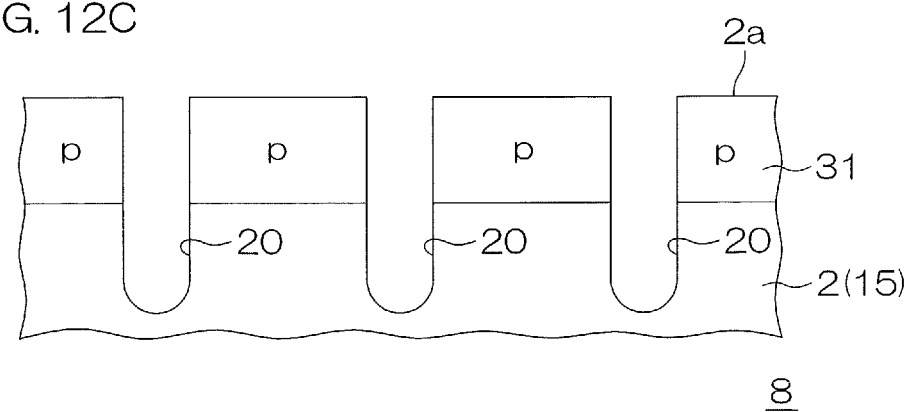
FIG. 12C is a cross-sectional view of a main portion for illustrating the method for manufacturing a semiconductor device.

Next, as shown in FIGS. 11C and 12C, dry etching through the hard mask 110 is performed to open the gate trench 20. Thereafter, the hard mask 110 is removed. The gate trench 20 may have an opening width of, for example, 1 μm to 2 μm (more specifically, 1.2 μm).

Figure 12D:
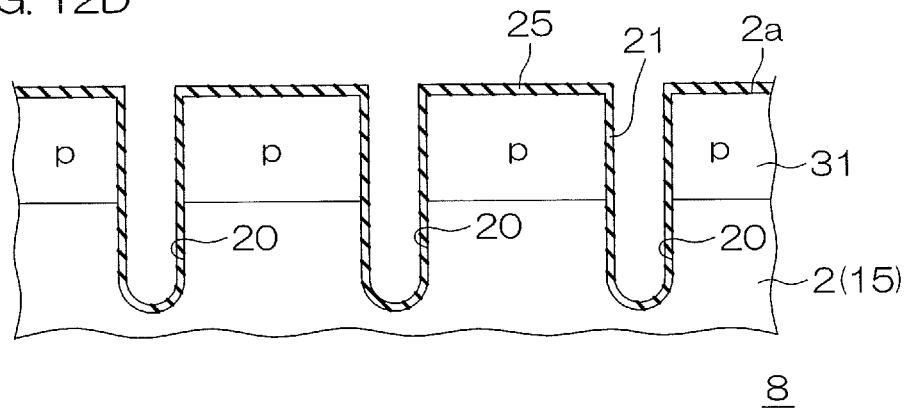
FIG. 12D is a cross-sectional view of a main portion for illustrating the method for manufacturing a semiconductor device.

Next, as shown in FIGS. 11D and 12D, the front surface of the semiconductor layer 2 is thermally oxidized to form a gate insulating layer 21. The gate insulating layer 21 covers the first principal surface 2a of the semiconductor layer 2 and the inner wall surface of the trench 20. The gate insulating layer 21 formed outside the trench 20, that is, on the first principal surface 2a forms a principal surface insulating layer 25.

Figure 12E:
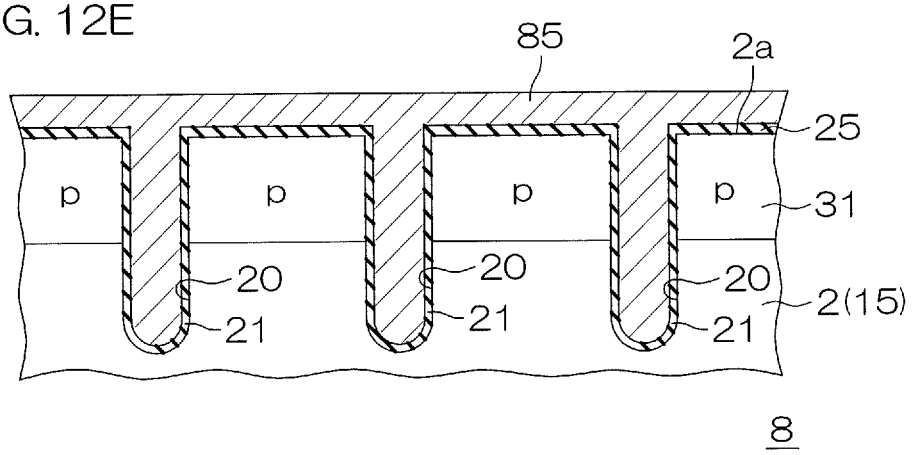
FIG. 12E is a cross-sectional view of a main portion for illustrating the method for manufacturing a semiconductor device.

Next, as shown in FIGS. 11E and 12E, a polysilicon film 85 is deposited on the semiconductor layer 2 using a CVD method with addition of n-type impurities such as phosphorus. At the same time, polysilicon provided with electrical conductivity by the n-type impurities is embedded in the gate trench 20. The polysilicon film 85 on the first principal surface 2a of the semiconductor layer 2 may have a thickness of, for example, 0.5 μm to 1 μm (more specifically, 0.6 μm). Forming the polysilicon film 85 with a thickness half or greater than half of the opening width of the gate trench 20 allows the polysilicon to be embedded in the gate trench 20.

Figure 12F:
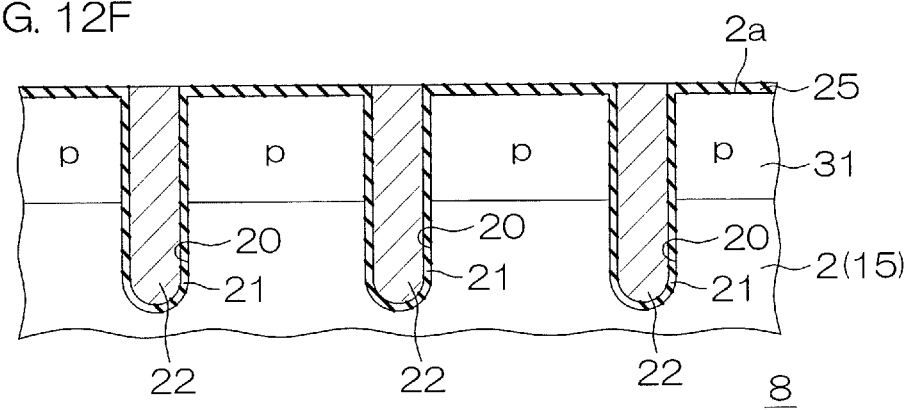
FIG. 12F is a cross-sectional view of a main portion for illustrating the method for manufacturing a semiconductor device.

Next, as shown in FIGS. 11F and 12F, a mask 111 (e.g. photoresist mask) covering the polysilicon film 85 of the temperature sensitive diode region 9 is formed, through which the polysilicon film 85 is etched back to remove unnecessary portions thereof. This causes a gate electrode layer 22 composed of polysilicon to be left within the gate trench 20. A portion of the polysilicon film 85 corresponding to a gate lead-out electrode layer 13 (see FIG. 2) is also left on the principal surface insulating layer 25 outside the gate trench 20. Further in the temperature sensitive diode region 9, the polysilicon film 85 on the principal surface insulating layer 25 is left to form a polysilicon layer 50, while the polysilicon film 85 in the other regions is removed.

Figure 12G:
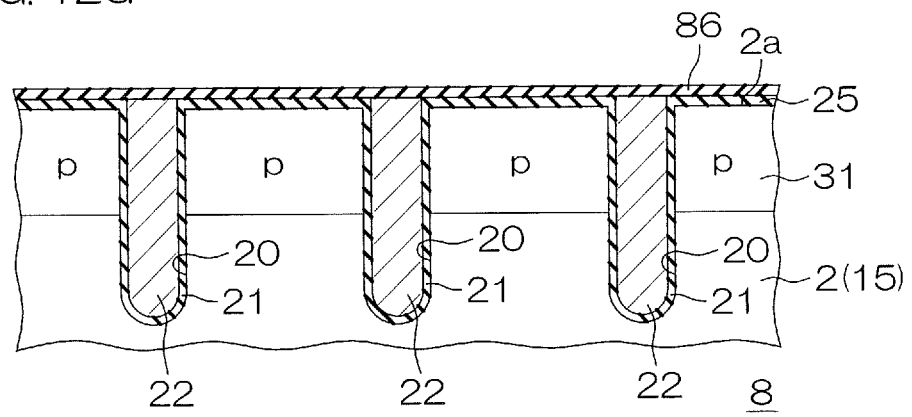
FIG. 12G is a cross-sectional view of a main portion for illustrating the method for manufacturing a semiconductor device.

Next, as shown in FIGS. 11G and 12G, a protective film 86 is formed on the entire surface. The protective film 86 may be a silicon oxide film formed using a CVD method. The protective film 86 protects the front surface of the underlying layer during impurity ion implantation to be described next.

Figure 12H:
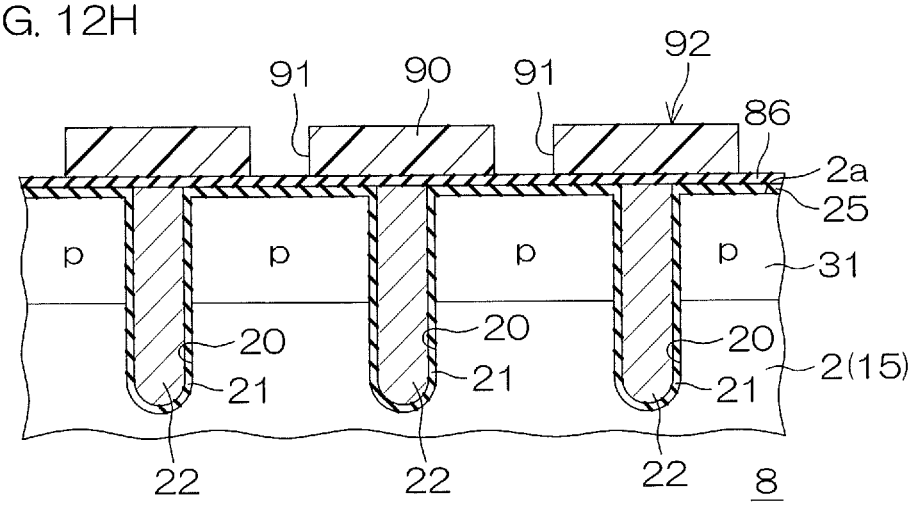
FIG. 12H is a cross-sectional view of a main portion for illustrating the method for manufacturing a semiconductor device.
Figure 12:
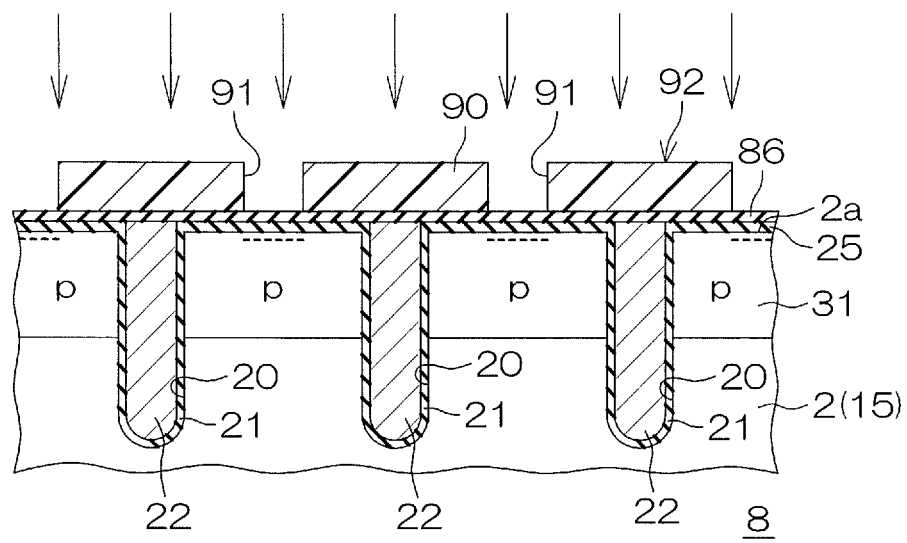
FIG. 12I is a cross-sectional view of a main portion for illustrating the method for manufacturing a semiconductor device.
FIG. 12J is a cross-sectional view of a main portion for illustrating the method for manufacturing a semiconductor device.
FIG. 12K is a cross-sectional view of a main portion for illustrating the method for manufacturing a semiconductor device.
FIG. 12L is a cross-sectional view of a main portion for illustrating the method for manufacturing a semiconductor device.
FIG. 12M is a cross-sectional view of a main portion for illustrating the method for manufacturing a semiconductor device.

Next, as shown in FIGS. 11H and 12H, a photoresist mask 90 is formed for p-type impurity ion implantation. The photoresist mask 90 has a form described with reference to FIG. 9. That is, the photoresist mask 90 has multiple element openings 91 corresponding to $p^+$-type contact regions 33 in the cell region 8 and multiple diode openings 93 corresponding to anode regions 61, 62 in the temperature sensitive diode region 9. A monitoring pattern 95 is then formed within a diode opening 93 corresponding to each of the anode regions 61, 62 of one or both of the dummy diodes 47, 48, for example.

The formation of the photoresist mask 90 includes the steps of forming a photoresist layer, exposing the photoresist layer with an exposure machine, and developing the exposed photoresist layer.

The photoresist mask 90 is inspected with a semi-finished product in which the photoresist mask 90 is formed. Specifically, a scanning electron microscope is used to observe the cell region 8 and the temperature sensitive diode region 9. This allows to confirm that the dimension and disposition of a mask pattern (element pattern 92) formed in the cell region 8 are within a predetermined process margin range and that the dimension and line width of a mask pattern (diode pattern 94) formed in the temperature sensitive diode region 9 are within a predetermined process margin range. If the dimension or disposition of the mask pattern in either of the regions is not within the predetermined process margin range, the following steps are skipped and the semi-finished product is discarded.

The cell region 8 and the temperature sensitive diode region 9 are observed with scanning electron microscopes having the same magnification. In this case, upon observation of the temperature sensitive diode region 9, the monitoring pattern 95 is observed with the scanning electron microscope and its dimension and disposition are examined. A similar monitoring pattern may be provided in the cell region 8 and, upon inspection of the cell region 8 as well, the monitoring pattern may be observed with the scanning electron microscope.

After confirming that the photoresist mask 90 is thus formed at an appropriate accuracy in both the cell region 8 and the temperature sensitive diode region 9, p-type impurity ions such as boron are implanted through the photoresist mask 90, as shown in FIGS. 11I and 12I. The photoresist mask 90 is then peeled off. The p-type impurity ion implantation may be single-state implantation or multiple-stage implantation.

Figure 12J:
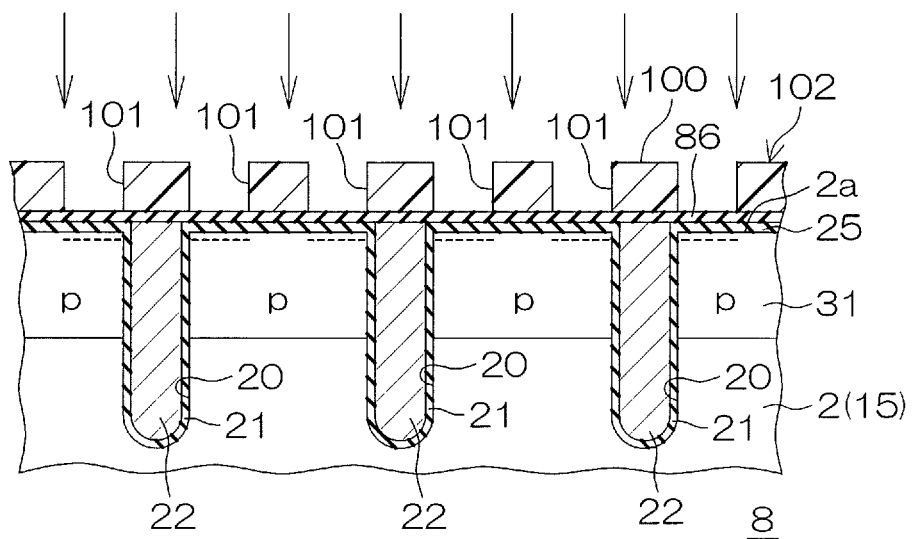

Next, as shown in FIGS. 11J and 12J, a photoresist mask 100 is formed for n-type impurity ion implantation. The photoresist mask 100 has a form described with reference to FIG. 10. That is, the photoresist mask 100 has element openings 101 corresponding to n-type emitter regions 32 in the cell region 8 and diode openings 103 corresponding to cathode regions in the temperature sensitive diode region 9. A monitoring pattern 105 is then provided at a position corresponding to each of the anode regions 61, 62 of the dummy diodes 47, 48, for example.

The formation of the photoresist mask 100 includes the steps of forming a photoresist layer, exposing the photoresist layer with an exposure machine, and developing the exposed photoresist layer.

The photoresist mask 100 is inspected with a semi-finished product in which the photoresist mask 100 is formed. Specifically, a scanning electron microscope is used to observe the cell region 8 and the temperature sensitive diode region 9. This allows to confirm that the dimension and disposition of a mask pattern (element pattern 102) formed in the cell region 8 are within a predetermined process margin range and that the dimension and line width of a mask pattern (diode pattern 104) formed in the temperature sensitive diode region 9 are within a predetermined process margin range. If the dimension or disposition of the mask pattern in either of the regions is not within the predetermined process margin range, the following steps are skipped and the semi-finished product is discarded.

The cell region 8 and the temperature sensitive diode region 9 are observed with scanning electron microscopes having the same magnification. In this case, upon observation of the temperature sensitive diode region 9, the monitoring pattern 105 is observed with the scanning electron microscope and its dimension and disposition are examined. A similar monitoring pattern may be provided in the cell region 8 and, upon inspection of the cell region 8 as well, the monitoring pattern may be observed with the scanning electron microscope.

After confirming that the photoresist mask 100 is thus formed at an appropriate accuracy in both the cell region 8 and the temperature sensitive diode region 9, n-type impurity ions such as phosphorus, arsenic, etc., are implanted through the photoresist mask 100, as shown in FIGS. 11J and 12IJ. The photoresist mask 100 is then peeled off. The n-type impurity ion implantation may be single-state implantation or multiple-stage implantation.

Figure 12K:
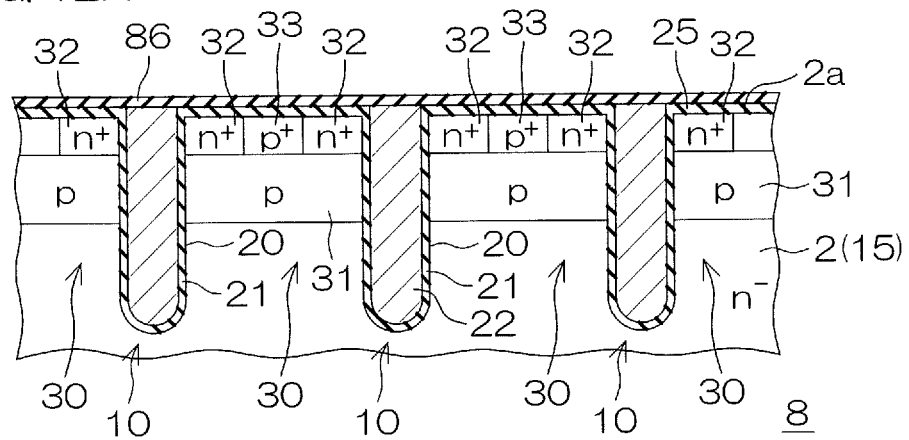

Next, as shown in FIGS. 11K and 12K, thermal processing (drive-in) is performed, whereby impurity ions implanted in the semiconductor layer 2 are diffused and impurity ions implanted in the polysilicon layer 50 are diffused. This causes p⁺-type contact regions 33 and n⁺-type emitter regions 32 to be formed within the body region 31 of the semiconductor layer 2. Also, p-type anode regions 61, 62 and n-type cathode regions 63, 64 are formed within the polysilicon layer 50, between which a pn junction portion 60 is formed.

Figure 12L:
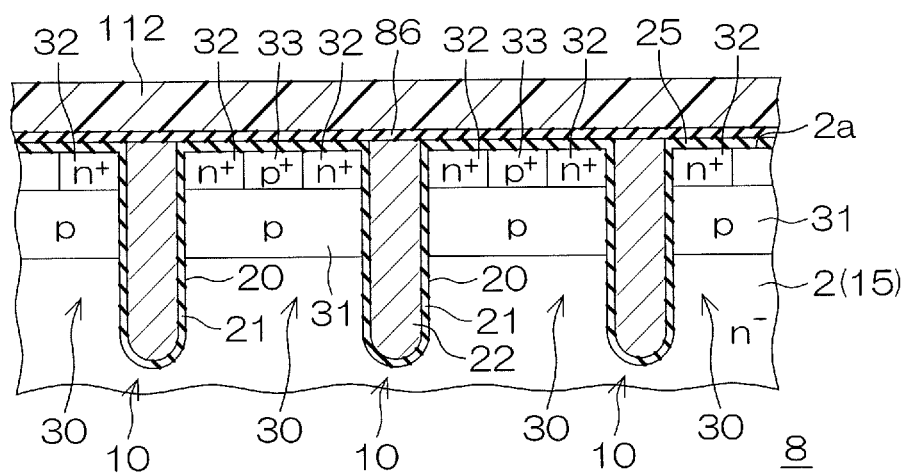

Subsequently, as shown in FIGS. 11L and 12L, a photoresist mask 112 is formed for dividing the polysilicon layer 50. Etching through the photoresist mask 112 is performed to divide the polysilicon layer 50 into regions of the individual diodes 43, 44, 47, 48. The photoresist mask 112 is then peeled off.

Figure 12M:
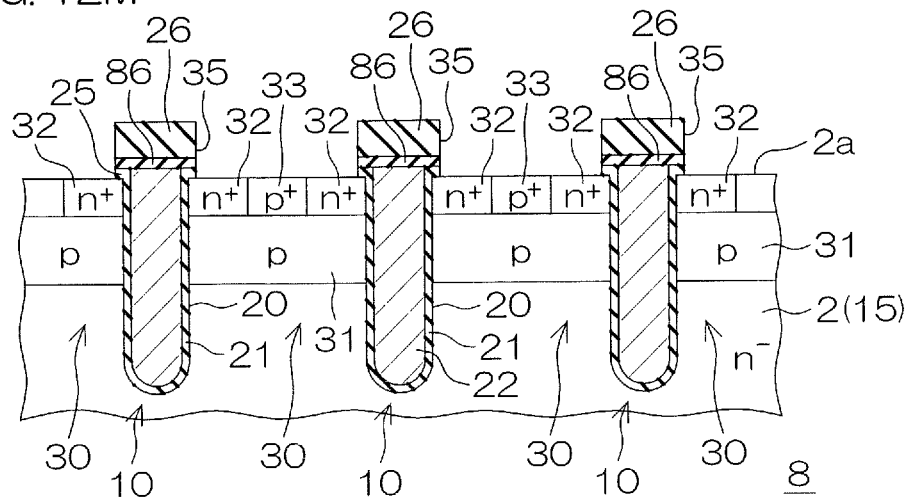

Subsequently, as shown in FIGS. 11M and 12M, an interlayer insulating layer 26 is formed, and an emitter contact opening 35, anode openings 65, 66, cathode openings 67, 68, etc., are formed in a manner penetrating the interlayer insulating layer 26 and the protective film 86.

Subsequently, as shown in FIGS. 3 and 8, an electrode film 87 is formed on the interlayer insulating layer 26 using, for example, a sputtering method. The electrode film 87 includes, for example, a barrier film 88 and a main electrode film 89 laminated on the barrier film 88. The electrode film 87 is etched to form a gate terminal electrode 6, an emitter terminal electrode 5, and diode wires 71, 72 (anode electrodes 73, 74, cathode electrodes 75, 76, and connection electrodes 77, 78). The barrier film 88 may contain, for example, titanium and/or titanium nitride. Specifically, it may have a single-layer structure including a titanium layer or a titanium nitride layer or a laminated structure in which a titanium layer and a titanium nitride layer are laminated. The main electrode film 89 may contain at least one type of substance among aluminum, copper, Al—Si—Cu (aluminum-silicon-copper) alloy, Al—Si (aluminum-silicon) alloy, and Al—Cu (aluminum-copper) alloy.

Further, p-type impurity ions are introduced to the rear surface side of the semiconductor substrate 15 and thermally diffused to form a collector region 17. A collector electrode 16 in contact with the collector region 17 is then formed using, for example, a sputtering method. The material example for the collector electrode 16 may be the same as the above-mentioned material example for the main electrode film 89.

Figure 13A:
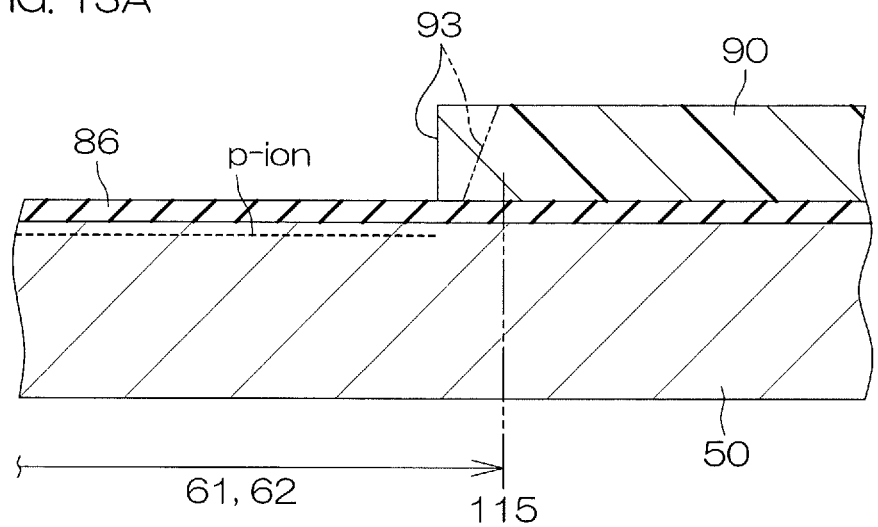
FIG. 13A is a diagrammatic cross-sectional view for illustrating pn junction shift in a state where a photoresist mask for p-type impurity ion implantation is formed.

FIG. 13A is a diagrammatic cross-sectional view for illustrating pn junction shift in a state where the photoresist mask 90 is formed. As shown in FIG. 13A, the photoresist mask 90, which is used when p-type impurity ions are implanted, has diode openings 93 through which the anode regions 61, 62 are exposed. Each of the diode openings 93 has an opening edge at a position retracted inward from the outer edge of the anode regions 61, 62, that is, the position where the pn junction portion 60 is formed by a predetermined distance (e.g. 0.5 µm to 1 µm). p-type impurity ions are implanted into a region corresponding to such a diode opening 93. The implanted p-type impurity ions are then thermally processed to be diffused to the position of the outer edge of the anode regions 61, 62, that is, a predetermined pn junction position 115.

In an exposure step during formation of the photoresist mask 90, if the exposure machine were poorly adjusted to suffer from, for example, out-of-focus, the resultant photoresist mask 90 deteriorates. Specifically, the opening edge of the diode opening 93 may shift from a predetermined position and/or have a blunt shape as indicated by the alternate long and two short dashed line. This accordingly causes the region for implantation of p-type impurity ions thereinto and its profile to vary. As a result, diffusion through thermal processing may cause the p-type impurities not to be diffused to the predetermined pn junction position 115 or to be diffused beyond the predetermined pn junction position 115. If the pn junction position thus shifted, the junction length of the pn junction portion 60 may deviate from a designed value.

As mentioned above, the resultant photoresist mask 90 can be confirmed by observing the line width of the monitoring pattern 95 with a scanning electron microscope. If the line width of the monitoring pattern 95 is different from a predetermined value by a predetermined process margin (e.g. within ±1 µm and, in some cases, within ±0.1 µm) or more, it is determined that the monitoring pattern 95 has undergone a defective process. A necessary measure is then made such as adjustment of the exposure machine.

Figure 13B:
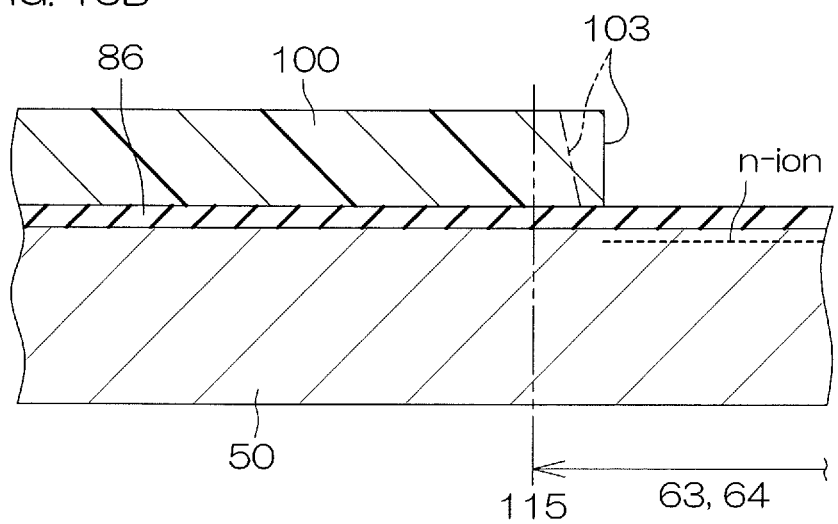
FIG. 13B is a diagrammatic cross-sectional view for illustrating pn junction shift in a state where a photoresist mask for n-type impurity ion implantation is formed.

FIG. 13B is a diagrammatic cross-sectional view for illustrating pn junction shift in a state where the photoresist mask 100 is formed. As shown in FIG. 13B, the photoresist mask 100, which is used when n-type impurity ions are implanted, has diode openings 103 through which the cathode regions 63, 64 are exposed. Each of the diode openings 103 has an opening edge at a position retracted inward from the outer edge of the cathode regions 63, 64, that is, the position where the pn junction portion 60 is formed by a predetermined distance (e.g. 0.5 µm to 1 µm). n-type impurity ions are implanted into a region corresponding to such a diode opening 103. The implanted n-type impurity ions are then thermally processed to be diffused to the position of the outer edge of the cathode regions 63, 64, that is, a predetermined pn junction position 115.

In an exposure step during formation of the photoresist mask 100, if the exposure machine were poorly adjusted to suffer from, for example, out-of-focus, the resultant photoresist mask 100 deteriorates. Specifically, the opening edge of the diode opening 103 may shift from a predetermined position and/or have a blunt shape as indicated by the alternate long and two short dashed line. This accordingly causes the region for implantation of n-type impurity ions thereinto and its profile to vary. As a result, diffusion through thermal processing may cause the n-type impurities not to be diffused to the predetermined pn junction position 115 or to be diffused beyond the predetermined pn junction position 115. If the pn junction position thus shifted, the junction length of the pn junction portion 60 may deviate from a designed value.

As mentioned above, the resultant photoresist mask 100 can be confirmed by observing the line width of the monitoring pattern 105 with a scanning electron microscope. If the line width of the monitoring pattern 105 is different from a predetermined value by a predetermined process margin (e.g. within ±1 µm and, in some cases, within ±0.1 µm) or more, it is determined that the monitoring pattern 105 has undergone a defective process. A necessary measure is then made such as adjustment of the exposure machine.

The variation in the junction length of the pn junction portion 60 causes the forward voltage characteristics of each first diode 43 as a sensor diode to vary and accordingly the forward voltage characteristics of the temperature sensitive diode sensor 41 to vary. For example, the forward voltage of the temperature sensitive diode sensor 41 may deviate from a designed value by about ±5 mV and the slope of the current-voltage characteristics (IV characteristics) may also deviate from a designed value. Accordingly, the temperature sensitive diode sensor 41 may inaccurately detect temperature.

In this preferred embodiment, since the resultant photoresist masks 90, 100 can be inspected in detail even in the temperature sensitive diode region 9, it is possible to manufacture the semiconductor device 1 while appropriately examining the adjustment state of the exposure machine, etc. This allows to reduce the problem of yield due to defective formation of the temperature sensitive diode sensor 41.

Thus, in the manufacturing method according to this preferred embodiment, power transistor cells 11, which are semiconductor elements or devices that generate heat during operation, are formed in the active region 3 of the semiconductor layer 2 (semiconductor substrate 15), and a temperature sensitive diode sensor 41 arranged to detect temperature is formed in the temperature sensitive diode region 9 of the semiconductor layer 2 (semiconductor substrate 15). The manufacturing method includes the step of forming a polysilicon layer 50 for composing the temperature sensitive diode sensor 41 in the temperature sensitive diode region 9. The manufacturing method also includes the step of forming a mask (photoresist mask 90) used when p-type impurities are introduced to the semiconductor layer 2 and the polysilicon layer 50.

The photoresist mask 90 has an element pattern 92. The photoresist mask 90 has a diode pattern 94. The photoresist mask 90 has a monitoring pattern 95. The element pattern 92 has element openings 91 through which regions composing the power transistor cells 11 (semiconductor elements or devices) (regions corresponding to the p$^+$-type contact regions 33) are exposed in the active region 3. The diode pattern 94 has diode openings 93 through which a portion of the temperature sensitive diode region 9 (regions corresponding to the anode regions 61, 62) is exposed. The monitoring pattern 95 is provided within the diode pattern 94 with a size smaller than that of the diode openings 93. More specifically, the monitoring pattern 95 has a line width smaller than the line width of the diode openings 93.

The manufacturing method includes the step of introducing p-type impurities (implanting ions in this preferred embodiment) into the semiconductor layer 2 and the polysilicon layer 50 through such a photoresist mask 90 as described above.

The manufacturing method further includes the step of forming a mask (photoresist mask 100) used when n-type impurities are introduced to the semiconductor layer 2 and the polysilicon layer 50.

The photoresist mask 100 has an element pattern 102, a diode pattern 104, and a monitoring pattern 105. The element pattern 102 has element openings 101 through which regions composing the power transistor cells 11 (semiconductor elements or devices) (regions corresponding to the n$^+$-type emitter regions 32) are exposed in the active region 3. The diode pattern 104 has diode openings 103 through which a portion of the temperature sensitive diode region 9 (regions corresponding to the cathode regions 63, 64) is exposed. The monitoring pattern 105 is provided within the diode pattern 104 with a size smaller than that of the diode openings 103. More specifically, the monitoring pattern 105 has a line width smaller than the line width of the diode openings 103.

The manufacturing method includes the step of introducing n-type impurities (implanting ions in this preferred embodiment) into the semiconductor layer 2 and the polysilicon layer 50 through such a photoresist mask 100 as described above.

In the manufacturing method, since the monitoring patterns 95, 105 are formed within the diode patterns 94, 104 of the photoresist masks 90, 100, it is possible to examine the resultant photoresist masks 90, 100 in the temperature sensitive diode region 9 by observing the monitoring patterns 95, 105 with an electron microscope. In particular, since the monitoring patterns 95, 105 are smaller than the diode openings 93, 103 (specifically in the line width), it is possible to observe the monitoring patterns 95, 105 at the same magnification as when the element pattern 92 of the photoresist mask 90 is observed. The subsequent process can therefore be performed after rapidly confirming that the photoresist masks 90, 100 are formed at an accuracy within a required process margin in both the cell region 8 and the temperature sensitive diode region 9. If the required process margin is not ensured in either one of the cell region 8 and the temperature sensitive diode region 9, an appropriate measure is undertaken such as adjustment of the exposure machine. This allows for reduction in the number of defective products and therefore improvement in the yield.

In particular, in this preferred embodiment, the monitoring patterns 95, 105 have a line width observable with an electron microscope having a magnification at which the line width of the element patterns 92, 102 can be observed. It is thus possible to observe the element patterns 92, 102 and the monitoring patterns 95, 105 with electron microscopes having the same magnification and thereby to rapidly inspect the photoresist masks 90, 100.

Also, in this preferred embodiment, the monitoring pattern 95 of the photoresist mask 90 is disposed within one of the diode openings 93. Since the monitoring pattern 95 is thus disposed within a region corresponding to an impurity region (e.g. anode regions 61, 62) composing one of the diodes 43, 44, 47, 48 (e.g. dummy diodes 47, 48), it is possible to examine the resultant photoresist mask 90 within the regions in which the diodes 43, 44, 47, 48 are formed. It is therefore possible to integrate the diodes 43, 44, 47, 48 with a high degree of accuracy.

Also, in this preferred embodiment, the monitoring pattern 105 of the photoresist mask 100 is disposed outside the diode openings 103. If the diode openings 103 have a small size, disposing the monitoring pattern 105 outside the diode openings 103 allows for reduction in the effect of the monitoring pattern 105. Specifically, in this preferred embodiment, the cathode regions 63, 64 are each zonally C-shaped or U-shaped, to which the shape of the diode openings 103 corresponds. The monitoring pattern 105 is hence disposed outside the diode openings 103. Specifically, it is disposed in a region corresponding to one of the anode regions 61, 62, which has a relatively large area. This allows the monitoring pattern 105 to be formed without affecting the cathode regions 63, 64 and not to have a major effect on the relatively large anode regions 61, 62.

In this preferred embodiment, the diodes 43, 44, 47, 48 having the anode regions 61, 62 and the cathode regions 63, 64 are formed in the temperature sensitive diode region 9. The monitoring pattern 95, 105 are then disposed in regions corresponding to the anode regions 61, 62. In particular, if the anode regions 61, 62 have a relatively large area, such a disposition is advantageously employed.

The manufacturing method according to this preferred embodiment includes the step of forming an anode terminal electrode 37 and a cathode terminal electrode 38 to be connected to the temperature sensitive diode sensor 41. The first diodes 43 as sensor diodes and the dummy diodes 47, 48 are formed in the temperature sensitive diode region 9. The first diodes 43 (sensor diodes) are connected between the anode terminal electrode 37 and the cathode terminal electrode 38. The dummy diodes 47, 48 are not connected between the anode terminal electrode 37 and the cathode terminal electrode 38. That is, the dummy diodes 47, 48 substantially have no electrical function. The diode patterns 94, 104 have sensor patterns 94S, 104S corresponding to the first diodes 43 (sensor diodes) and dummy patterns 94D, 104D corresponding to the dummy diodes 47, 48. In this preferred embodiment, the dummy patterns 94D, 104D have substantially the same shape and size as the sensor patterns 94S, 104S. The monitoring patterns 95, 105 are incorporated in the dummy patterns 94D, 104D.

Since the monitoring patterns 95, 105 are thus incorporated in the dummy patterns 94D, 104D corresponding to the dummy diodes 47, 48 that substantially have no electrical function, it is possible to provide the monitoring patterns 95, 105 in the temperature sensitive diode region 9 without affecting the electrical characteristics of the first diodes 43 (sensor diodes).

The manufacturing method according to this preferred embodiment also includes the step of forming an anode terminal electrode 37 and a cathode terminal electrode 38 to be connected to the temperature sensitive diode sensor 41. The first diodes 43 as sensor diodes and the second diodes 44 as protective diodes are formed in the temperature sensitive diode region 9. The first diodes 43 (sensor diodes) are connected between the anode terminal electrode 37 and the cathode terminal electrode 38. The second diodes 44 (protective diodes) are connected anti-parallel to the first diodes 43 (sensor diodes) between the anode terminal electrode 37 and the cathode terminal electrode 38. The second diodes 44 form a protective element 42 arranged to absorb electrostatic surge to protect the temperature sensitive diode sensor 41.

Since the electrical characteristics of the second diodes 44 (protective diodes) do not affect the accuracy of temperature detection, the monitoring patterns 95, 105 may be incorporated in the diode pattern 94 (protective pattern 94P) of the second diodes 44.

This preferred embodiment further provides the semiconductor device 1. The semiconductor device 1 includes the semiconductor layer 2 (semiconductor substrate 15). The semiconductor device 1 includes the power transistor cell 11 (semiconductor element or device) that is included in the active region 3 of the semiconductor layer 2 and generates heat during operation. The semiconductor device 1 includes the temperature sensitive diode sensor 41 included in the temperature sensitive diode region 9 of the semiconductor layer 2 and arranged to detect temperature. The temperature sensitive diode sensor 41 includes the polysilicon layer 50 formed in the temperature sensitive diode region 9. The diodes 43, 44, 47, 48 are formed in the temperature sensitive diode region 9. The diodes 43, 44, 47, 48 include the anode regions 61, 62 in which p-type impurities are introduced into the polysilicon layer 50 and the cathode regions 63, 64 in which n-type impurities are introduced into the polysilicon layer 50. In the temperature sensitive diode region 9, the monitoring impurity patterns 97, 107 having a line width smaller than that in the anode regions 61, 62 or the cathode regions 63, 64 are formed in the polysilicon layer 50.

The thus configured semiconductor device 1 can be fabricated using the above-mentioned manufacturing method. The monitoring impurity patterns 97, 107 can be used as quality control indices indicating that the fabrication has undergone a highly accurate process in which both of the cell region 8 and the temperature sensitive diode region 9 are observed with an electron microscope with respect to the photoresist masks 90, 100.

In common with the relationship between the monitoring patterns 95, 105 and the element patterns 92, 102, the monitoring impurity patterns 97, 107 have a line width observable with an electron microscope having a magnification at which the line width of the element impurity patterns (contact regions 33, emitter regions 32, etc.) composing the power transistor cells 11 (semiconductor elements or devices) can be observed.

Also, in this preferred embodiment, the monitoring impurity patterns 97, 107 are formed in the anode regions 61, 62 in a manner corresponding to the disposition of the monitoring patterns 95, 105 of the photoresist masks 90, 100. If the cathode regions 63, 64 have a relatively large area, one or both of the monitoring patterns 95, 105 may be disposed within regions corresponding to the cathode regions 63, 64. In this case, monitoring impurity patterns are formed correspondingly within the cathode regions 63, 64.

The semiconductor device 1 according to this preferred embodiment includes the anode terminal electrode 37 and the cathode terminal electrode 38 connected to the temperature sensitive diode sensor 41. The diodes formed in the temperature sensitive diode region 9 include the first diodes 43 (sensor diodes) connected between the anode terminal electrode 37 and the cathode terminal electrode 38 to compose the temperature sensitive diode sensor 41. The diodes formed in the temperature sensitive diode region 9 also include the dummy diodes 47, 48 not connected between the anode terminal electrode 37 and the cathode terminal electrode 38. The monitoring impurity patterns 97, 107 are then formed in the regions of the dummy diodes 47, 48 (e.g. anode regions 61, 62). Accordingly, since the monitoring impurity patterns 97, 107 do not substantially affect the electrical characteristics of the first diodes 43 (sensor diodes), the temperature sensitive diode sensor 41 can detect temperature accurately.

The semiconductor device 1 according to this preferred embodiment includes the anode terminal electrode 37 and the cathode terminal electrode 38 connected to the temperature sensitive diode sensor 41. The diodes formed in the temperature sensitive diode region 9 include the first diodes 43 (sensor diodes) connected between the anode terminal electrode 37 and the cathode terminal electrode 38 to compose the temperature sensitive diode sensor 41. The diodes formed in the temperature sensitive diode region 9 also include the second diodes 44 (protective diodes) connected anti-parallel to the first diodes 43 (sensor diodes) between the anode terminal electrode 37 and the cathode terminal electrode 38. The second diodes 44 form the protective element 42 arranged to absorb electrostatic surge to protect the temperature sensitive diode sensor 41.

Since the electrical characteristics of the second diodes 44 (protective diodes) do not affect the accuracy of temperature detection, the monitoring impurity patterns 97, 107 may be formed in the regions of the second diodes 44.

Figure 14:
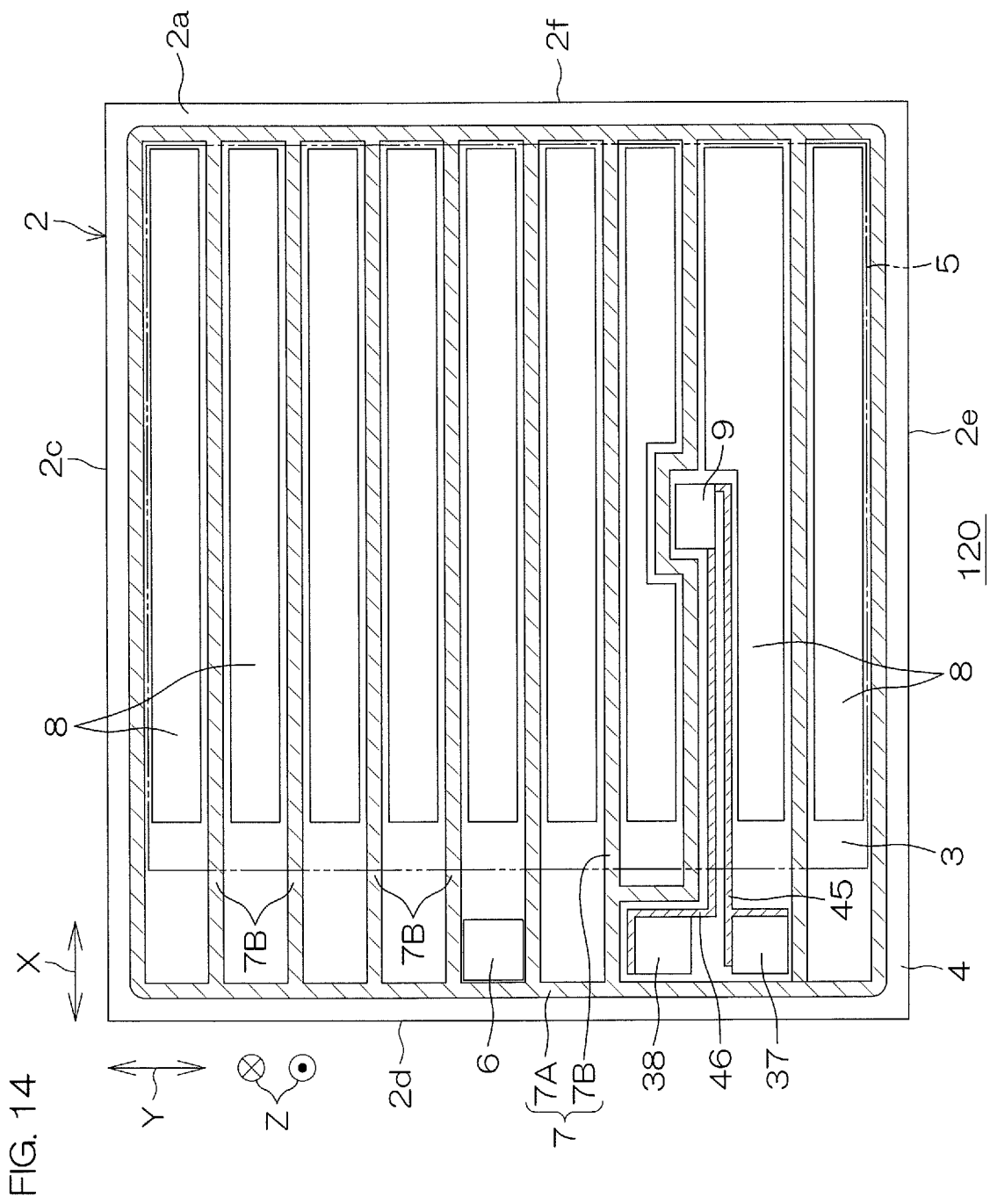
FIG. 14 is a plan view for illustrating a configuration of a semiconductor device according to another preferred embodiment of the present invention.

FIG. 14 is a plan view for illustrating a configuration of a semiconductor device 120 according to another preferred embodiment of the present invention. Since the configuration of the semiconductor device 120 is almost the same as that in the above-mentioned preferred embodiment except for the disposition of the temperature sensitive diode region 9, components in FIG. 14 corresponding to those in the above-mentioned preferred embodiment are designated by the same reference signs. Reference will also be made as appropriate to the drawings that have been referred to in the description of the above-mentioned preferred embodiment.

In this preferred embodiment, the temperature sensitive diode region 9 is provided within the active region 3 in a manner surrounded by the cell region 8. The thus configured semiconductor device 120 can also be fabricated using such a manufacturing method as mentioned above. This allows the accuracy of the pattern dimension and pattern disposition of the photoresist masks 90, 100 (see FIGS. 9 and 10) to be confirmed not only in the cell region 8 but also in the temperature sensitive diode region 9 in the middle of the manufacturing process and thereby the yield to be improved. Disposing the temperature sensitive diode region 9 within the active region 3 allows the temperature sensitive diode sensor 41 to detect heat generation from the active region 3 more accurately.

As is the case in the above-mentioned preferred embodiment, the monitoring impurity patterns 97, 107 (see FIG. 7) are formed in the temperature sensitive diode region 9. The monitoring impurity patterns 97, 107 can be observed with an electron microscope as appropriate. This allows to confirm that the semiconductor device 120 has been manufactured using a highly accurate method.

While the preferred embodiments of the present invention has heretofore been described, the present invention may be embodied in still other modes.

For example, the preferred embodiments above mainly describe an example in which the monitoring patterns 95, 105 are disposed in the dummy diode forming regions 55, 56 (dummy diode regions). Alternatively or additionally, the monitoring patterns may however be disposed in the first diode forming regions 53 (sensor diode regions) and/or the second diode forming regions 54 (protective diode regions).

Also, the preferred embodiments above mainly describe an example in which the monitoring patterns 95, 105 are disposed in regions corresponding to the anode regions 61, 62. Alternatively or additionally, the monitoring patterns may however be disposed in regions corresponding to the cathode regions 63, 64, as mentioned above. The monitoring patterns 95, 105, which are preferably formed at positions apart from the pn junction portion 60, may be in contact with the position of the pn junction portion 60 of the dummy diodes 47, 48 if the monitoring patterns 95, 105 are formed in the dummy diode forming regions 55, 56. Further, within the temperature sensitive diode region 9, the monitoring patterns may be disposed in regions corresponding to neither the anode regions nor the cathode regions.

Also, the preferred embodiments above describe an example in which the photoresist mask 90 used for p-type impurity ion implantation has the monitoring pattern 95 and the photoresist mask 100 used for n-type impurity ion implantation has the monitoring pattern 105. However, in some cases, the monitoring pattern of the photoresist mask 90 or the photoresist mask 100 may be omitted. For example, in the above-mentioned preferred embodiments, the polysilicon 50 is formed with n-type impurities added thereto. p-type impurity ions and n-type impurity ions are implanted into the n-type polysilicon layer 50 to form the anode regions 61, 62 and the cathode regions 63, 64, respectively. The polysilicon 50 therefore remains n-type in the regions not implanted with p-type impurity ions. Accordingly, the resultant photoresist mask 90 for p-type impurity ion implantation is more significant to the disposition of the pn junction portion 60. Hence, the monitoring pattern 105 of the photoresist mask 100 used for n-type impurity ion implantation may be omitted.

As for the cell region 8, a monitoring pattern (cell region monitoring pattern) having a line width equal to that of the contact regions 33, the emitter regions 32, etc., may be provided in the photoresist masks 90, 100 and observed with an electron microscope to evaluate the resultant photoresist masks 90, 100 within the cell region 8.

Further, the element pattern 102 and the monitoring patterns 95, 105, etc., of the photoresist masks 90, 100 and, in some cases, the element impurity patterns (contact regions 33, emitter regions 32, etc.) and the monitoring impurity patterns 97, 107 may be observed with a transmission electron microscope without limitation to a scanning electron microscope.

Also, in the above-mentioned preferred embodiments, the collector region 17 may be omitted and a MIS (Metal-Insulator-Semiconductor) type FET semiconductor device may be formed. In this case, "emitter" and "collector" is replaced, respectively, with "source" and "drain" in the description of the above-mentioned preferred embodiments. An $n^+$-type contact layer for Ohmic contact is preferably provided between the drain electrode 16 and the semiconductor layer 2.

Further, since the conductivity type of each portion of the semiconductor device 1 according to the above-mentioned preferred embodiment is merely an example, n-type region may be replaced with p-type region, and vice versa, in the above description and the accompanying drawings.

While preferred embodiments of the present invention were described in detail above, these are merely specific examples used to clarify the technical contents of the present invention and the present invention should not be interpreted as being limited to these specific examples and the scope of the present invention is limited only by the appended claims.

This application claims priority to Japanese Patent Application No. 2019-115733 filed on Jun. 21, 2019, the content of which is incorporated herein by reference in its entirety.

REFERENCE SIGNS LIST

1 Semiconductor device
2 Semiconductor layer
3 Active region
4 Outer region
5 Emitter terminal electrode
6 Gate terminal electrode
7 Gate wire
8 Cell region
9 Temperature sensitive diode region
10 Trench gate structure
11 Power transistor cell
15 Semiconductor substrate
16 Collector electrode
20 Gate trench
30 FET structure
31 Body region
32 Emitter region
33 Contact region
37 Anode terminal electrode
38 Cathode terminal electrode
41 Temperature sensitive diode sensor
42 Protective element
43 First diode
44 Second diode
47 First dummy diode
48 Second dummy diode 50 Polysilicon layer
53 First diode forming region
54 Second diode forming region
55 First dummy diode forming region
56 Second dummy diode forming region
60: pn junction portion
61 First anode region
62 Second anode region
63 First cathode region
64 Second cathode region
65 First anode opening
66 Second anode opening
67 First cathode opening
68 Second cathode opening
71 First diode wire
72 Second diode wire
73 First anode electrode
74 Second anode electrode
75 First cathode electrode
76 Second cathode electrode
77 First connection electrode
78 Second connection electrode
81 First series circuit
82 Second series circuit
85 Polysilicon film
90 Photoresist mask
91 Element opening
92 Element pattern
93 Diode opening
94 Diode pattern
94S Sensor pattern
94P Protective pattern
94D Dummy pattern
95 Monitoring pattern
95L Linear portion
97 Monitoring impurity pattern
100 Photoresist mask
101 Element opening
102 Element pattern
103 Diode opening
104 Diode pattern
104S Sensor pattern
104P Protective pattern
104D Dummy pattern
105 Monitoring pattern
105L Linear opening portion
107 Monitoring impurity pattern
115 Predetermined pn junction position
120 Semiconductor device

The invention claimed is:

1. A method for manufacturing a semiconductor device in which a semiconductor element that generates heat during operation is formed in an active region of a semiconductor substrate and a temperature sensitive diode sensor arranged to detect temperature is formed in a temperature sensitive diode region of the semiconductor substrate, the method comprising the steps of:
    forming a polysilicon layer that composes the temperature sensitive diode sensor in the temperature sensitive diode region;
    forming a mask that has an element pattern having an element opening through which a region composing the semiconductor element is exposed in the active region, a diode pattern having a diode opening through which a portion of the temperature sensitive diode region is exposed, and a monitoring pattern provided within the diode pattern with a size smaller than that of the diode opening; and
    introducing impurities through the mask into the semiconductor substrate and the polysilicon layer.

2. The method for manufacturing a semiconductor device according to claim 1, wherein the monitoring pattern has a line width observable with an electron microscope having a magnification at which a line width of the element pattern is observable.

3. The method for manufacturing a semiconductor device according to claim 1, further comprising the step of observing the element pattern and the monitoring pattern with an electron microscope having the same magnification.

4. The method for manufacturing a semiconductor device according to claim 1, wherein the monitoring pattern includes a monitoring pattern disposed within the diode opening.

5. The method for manufacturing a semiconductor device according to claim 1, wherein the monitoring pattern includes a monitoring pattern disposed outside the diode opening.

6. The method for manufacturing a semiconductor device according to claim 1, wherein a diode having an anode region and a cathode region is formed in the temperature sensitive diode region, and the monitoring pattern is disposed in a region corresponding to the anode region.

7. The method for manufacturing a semiconductor device according to claim 1, further comprising the step of forming an anode terminal electrode and a cathode terminal electrode to be connected to the temperature sensitive diode sensor, wherein
    a sensor diode to be connected between the anode terminal electrode and the cathode terminal electrode and a dummy diode not to be connected between the anode terminal electrode and the cathode terminal electrode are formed in the temperature sensitive diode region,
    the diode pattern has a sensor pattern corresponding to the sensor diode and a dummy pattern corresponding to the dummy diode, and
    the monitoring pattern is incorporated in the dummy pattern.

8. The method for manufacturing a semiconductor device according to claim 1, further comprising the step of forming an anode terminal electrode and a cathode terminal electrode to be connected to the temperature sensitive diode sensor, wherein
    a sensor diode to be connected between the anode terminal electrode and the cathode terminal electrode and a protective diode to be connected anti-parallel to the sensor diode between the anode terminal electrode and the cathode terminal electrode are formed in the temperature sensitive diode region.

* * * * *